United States Patent [19]

Girard

[11] Patent Number: 4,975,573

[45] Date of Patent: Dec. 4, 1990

[54] OPTICAL TEST BENCH

[75] Inventor: André Girard, Ville St-Luc, Canada

[73] Assignee: Oerlikon Aerospatiale, Saint-Jean-sur-Richelieu, Canada

[21] Appl. No.: 164,499

[22] Filed: Mar. 4, 1988

[51] Int. Cl.$^5$ ............................................. G12B 13/00
[52] U.S. Cl. ................................. 250/252.1; 250/341; 250/342; 350/321
[58] Field of Search ................ 250/252.1 A, 339, 353, 250/330, 341, 342; 350/321, 582, 588; 356/72, 73

[56]  References Cited

U.S. PATENT DOCUMENTS 2,399,971 5/1946 Wolfe ..................................... 350/588
4,626,685 12/1986 Pitalo et al. ........................... 250/342

OTHER PUBLICATIONS

Weiser, "Testing Image Quality in Electro-Optical Devices", Conference, Image Assessment & Specification, Rochester, N.Y., May 20–22, 1974, pp. 264–270.

Primary Examiner—Carolyn E. Fields
Attorney, Agent, or Firm—Pierre Lesperance

[57] ABSTRACT

An optical test bench for testing the technical characteristics of electromagnetic wave sensors and emitters of an air and ground surveillance electro-optical module mounted on a missile firing vehicle, the module capable of acquiring, ranging and tracking a target and of guiding a missile toward the target. This test device is specifically designed for factory and environmental testing, by opposition to laboratory controlled environment testing. The optical test bench of the invention includes: two parabolic off-axis collimating mirrors, for focusing the fields of view of the module to a common focal point; a computer-controlled focal plane system, including four test assemblies selectively shiftable to register with said focal point, and a laser alignment periscope system to exactly adjust each parabolic mirror relative to the other so that their focal points coincide.

46 Claims, 16 Drawing Sheets

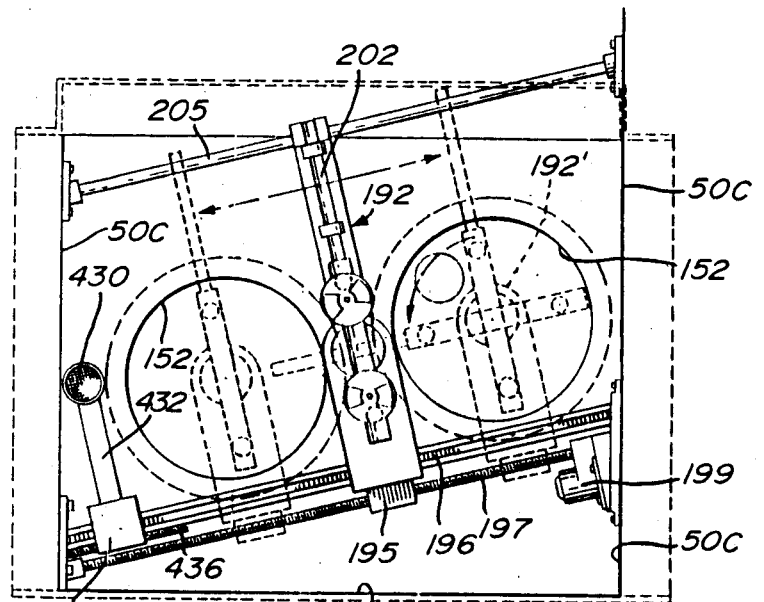
Fig. 8
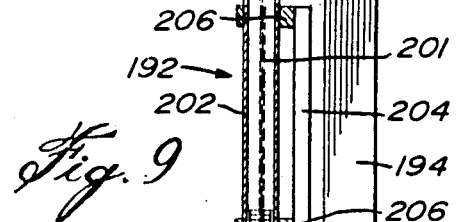
Fig. 9
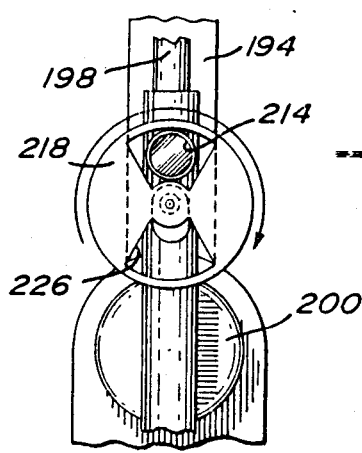
Fig. 10
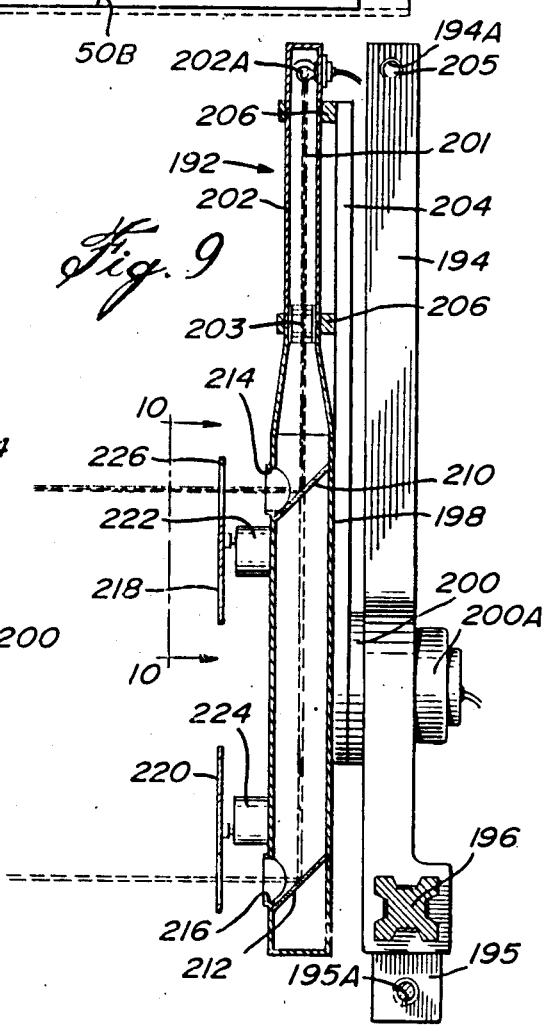

OPTICAL TEST BENCH

FIELD OF THE INVENTION

This invention generally relates to a system for testing whether or not the electromagnetic waves emitters and sensors of an electro-optical module meet design specifications. More particularly, the present optical test bench apparatus addresses the requirements of a module used on a combat vehicle for target acquisition and tracking and for missile guidance.

BACKGROUND OF THE INVENTION

In modern warfare, missiles constitute a most destructive weapon. A missile is a self-propelled guided projectile, comprising a propulsive system, an explosive head, and a guidance system housed in an equipment casing. The precision of the guidance system of a missile compared to target tracking is of utmost importance, since even a fraction of a degree of angle of error in the heading thereof can most undesirably shift the location of the area where the explosive head will detonate.

A radar is one type of guidance and target tracking system. It is a device which allows an operator to ascertain both the position and the distance of an obstacle or target, by the emission of electromagnetic waves and by the detection of the waves reflected on the surface of the obstacle. If the target being detected by the sensor is in motion relative to the radar, the echo signal will be shifted in frequency by the Doppler effect and may be used as a direct measurement of the relative target velocity. Radar principles have been applied at optical frequencies with masers (amplifiers of electromagnetic radiations with very low noise output), for the measurement of range and detection of small motions, using the Doppler-Fizeau effect.

Among known missile guidance and target tracking systems, electromagnetic sensors and optical masers (lasers) are particularly well suited. Noticeably, infrared masers and sensors are preferred by the military because of their discretion and efficiency.

These sensors and laser emitters may be part of an electro-optical module, mounted on a missile firing vehicle such as the ADATS TM vehicle. Some of these sensors are highly sensitive to infra-red radiations coming from the thrust exhaust of missiles (or even aircrafts).

One major problem which relates to such modern guidance systems is the on-the-field testing of the ground based optical module bearing the emitter and sensor, and more specifically the comparison and correlation of the operating physical features of the emitter or the sensor. (These optical elements are adapted to be carried inter alia by an automotive vehicle such as the ADATS TM air and ground surveillance system vehicle; such vehicle also carries missile cannisters for firing missiles to be guided by the electro-optical module.) The electro-optical module is usually tested and calibrated in a relatively thorough fashion, through use of a target board, such board being located at a far distance from the module to simulate battlefield conditions. However, due to several factors such as vibrations, environmental conditions, etc . . . during transport, slight aberrations may occur and the emitter may become disaligned relative to the sensor.

Battlefield conditions are of course not favorable to such meticulous verifications of the alignment of optical module elements, and accordingly, this problem of disalignment of the operating elements of the electro-optical module between factory testing and on-the-field actual use has remained unsolved until now.

Optical devices including lasers, collimators, beam splitters and photodetectors are currently the subject of several state of the art research and development projects in the industrial world. For instance, a magneto-optical data storage device, which has recently been reported by an important scientific magazine as being developed in the Santa Clara valley in California, employs a laser to write and read data. This device writes with a laser beam, via two collimating mirrors, a beam splitter and an objective lens, by heating a spot on a rotating magneto-optical medium whose coercivity drops with increasing temperature, making it possible to magnetize the heated spot easily with a weak applied magnetic field. To read the data, the laser beam is switched to a lower intensity and polarized by the insertion of a polarizing filter between the collimating lenses and the beam splitter. Because the plane of polarization is rotated when polarized light is reflected off the magnetized medium, a second polarizing filter is positioned in register with the beam splitter opposite the objective lens, to convert the change in polarisation of the reflected beam into a change in light intensity. A photodetector assembly, positioned downstream of the second polarizer, registers changes in intensity.

Another example of such optical device is found in the U.S. Pat. No. 4,315,150 issued in 1982 to Telatemp Corp. In this prior art patent, a laser gun 10 sends a horizontal laser beam 66 toward a beam splitter 64 to strike the latter. The laser beam 66 is thereafter split orthogonally in two separate beams, to wit, a substantially horizontal beam 70 and a downwardly extending vertical beam 68. Beam 70 passes through a beam expander lens 76, which will cause this beam to be slightly refracted in a downwardly-inclined direction, and also to diverge in a conical manner so as to strike a wall 56 about a first large circular area 54. Vertical beam 68 in turn strikes an inclined mirror 34 which folds the path of that beam toward wall 56, wherein reflected horizontal beam 68 will define a second small circular area 82 within first area 54 of the expanded beam 70.

In this U.S. Pat. No. 4,315,150, the position of the beam expander 76 relative to the beam splitter 64 can be adjusted, since the former is connected to the frame of the laser gun 10 by a mounting plate 78 adjusted by screws 80. Thus, the degree of divergence of the beam 70 can be monitored. In other words, the features of the large illuminated wall area 54 can be varied relative to that of the smaller illuminated area 82, for optical alignment purposes, whereby areas 54 and 82 may correspond to the principal focus of the basic reflector structure defined by the reflectors 44 and 46 of the laser gun 10 proper, by centering zone 82 relative to zone 54. Visual discrimination would be possible by relative light intensity levels between the brighter center 82 and the peripheral area of zone 54.

Among the tests that relate to a dual sensor/emitter optical module, one may use the black body device. A black body is a standard light source, consisting of a casing having a small bore through which escapes an internal infra-red beam. It is known that an ideal blackbody has a zero reflectivity and a 100% absorptivity; i.e. would appear completely black. The interest in the blackbody lies in the character of the radiation emitted by it when heated: the total emission of radiant energy from a black body takes place at a rate expressed by the Boltzmann law, while its spectral energy distribution is described by Planck's equation. The laboratory type of black body is a hollow metal cylinder, blackened inside, and completely closed except for a narrow slit in one end. When such an enclosure is heated, the radiation escaping through the opening closely resembles the ideal blackbody radiation, while light or other radiations entering by the slit is almost completely trapped by multiple reflection from the walls, so that the opening usually appears intensely black.

One particularly efficient sensor system is defined by the forward looking infra-red system or FLIR, which allows military crew members to see at night and in poor visibility conditions. Unlike radar, the FLIR emits no energy of its own that can be detected during operations. It can locate and track vehicles and, at its maximum magnification setting, can even delineate individual tree limbs and branches.

With respect to the principle of collimators referred to hereinabove, it is well known that a collimator may be a converging lens, at one of whose focal points is placed a small source of light, usually a pinhole or narrow slit upon which light is focused from behind. Rays diverging from this focal plane emerge from the objective lens in a parallel beam. The slit or other source is viewed through the collimator without parallax, since it appears at an infinite distance.

OBJECTS OF THE INVENTION

The general object of the present invention is to provide means for testing the physical properties of the sensors and emitters forming part of a dual emitter/sensor optical module, including their performance and functionality.

An object of the invention is to reduce the margin of error associated with the optical calibration tests made on the optical modules mounted on military air and ground surveillance systems.

Another object of the invention is to provide means to enable calibration tests for the optical module mounted on military air and ground surveillance systems, said tests to be effected in factory and outdoor battlefield-like conditions.

A further object of the invention is to provide means to reduce the margin of error associated with the relative positional adjustment of two parabolic off-axis collimating mirrors, to make their focal point coincide at a specific spatial location.

More particularly, an object of the invention is to provide testing means to verify the boresight ability of the optical sub-subsystems integrated into an optical module.

The objects of the present invention include means for testing the ranging performance or telemetry capability of an optical ranger transceiver.

The objects of the invention also include means to test the target tracking capabilities of an optical tracking sensor.

The objects of the present invention further include means to test the discriminative power of an optical tracking sensor for a simulated target relative to a simulated sky background, wherein the relative light intensity is varied from a low to a high candle light level.

Other objects of the invention will readily appear to the knowledgeable scientist upon reading the following detailed description of the drawings.

SUMMARY OF THE INVENTION

A device for testing the technical characteristics of electromagnetic wave sensors integrated with emitters, such as sensors sensitive to the visible and infrared (IR) portion of the electromagnetic spectrum, and emitters such as lasers including near IR and far IR lasers. The test device may also be used to verify the boresight ability of the corresponding integrated optical sub-systems. This test device is specifically designed for factory and environmental testing, by opposition to laboratory controlled-environment testing, and could ultimately be operated by a single person.

The present optical test bench (OTB) is based on the collimating principle. The purpose of the OTB is to test the performances and verify the functionality of IR and visible sensors like the television T.V. camera (in the visible bandwidth of the electro-magnetic wave spectrum) and forward-looking infra red (FLIR) sensors, and laser systems like laser rangefinders and missile guidance lasers (MGL) integrated in an optical module.

In the case of the ADATS TM, the OTB is used to verify and test an electro-optical module (e-o module) at the missile system level in factory during the integration phase, during the acceptance, qualification and reliability and maintenability tests, and on the field during maintenance tests, and finally as a training aid to simulate battlefield conditions.

Moreover, the optical test bench (OTB) can be used with various types of ADATS TM vehicles like the M113A2, the M3, the SISU, etc . . .

More specifically, the OTB is used to verify the functionality and operation of the e-o module optical sub-systems; test the performances of the e-o module optical sub-systems; verify the boresight ability of the e-o module optical sub-systems; test the target and missile tracking ability of the eo module; and for boresighting the e-o module optical sub-systems when an ADATS TM boresight module is not available.

The e-o module optical sub-systems consist of IR and near IR sensors and a laser rangefinder (LR) and missile guidance laser (MGL). The IR and near IR sensors consist of a FLIR sensor, a TV and a missile tracker (MT).

The OTB uses a double collimator mirror system (DCMS), including two off-axis parabolic mirrors which reflect light to/from a focal plane system (FPS). The light is directed to/from the FPS by the use of a collector mirror folding the light path. A single parabolic mirror could be used instead of two but the weight and cost would be excessive. To ensure minimum mechanical stress, the two parabolic mirrors are mounted on a single mounting plate.

The FPS consists of an integrated assembly of various radiators and detectors, mounted on a mechanical moving stage.

One assembly consists of a differential blackbody assembly (DBA) radiator mounted after a series of four-bar targets. This assembly is used to test the FLIR.

A second assembly consists of a boresight test assembly (BTA) which consists of a beamsplitter after which are orthogonally placed a pyroelectric detector and a broad bandwidth/spectrum lamp. The beamsplitter is mounted after a pinhole. This assembly is used to test the MGL and the LR optical performances, and verify simultaneously the boresight ability of EO module subsystems. This assembly is also used as the detection system for the laser alignment periscope system (LAPS) of the OTB.

A third assembly consists of a laser ranger test assembly (LRTA) that is used to test ranging performance of the LR. The target range is simulated by a time delay line between the pyroelectric detector and the LED. Moreover, an attenuator is used after the beamsplitter, to avoid damage of the detector and the LED by the powerful laser ranger (LR) pulse.

A fourth assembly consists of a tracking test assembly (TTA). This arrangement consists of frosted glass plate through the edge of which is mounted a distributed series of LED, and on which is etched a simulated target behind which is mounted a broad bandwidth spectrum lamp to simulate the background day light. This arrangement is capable of movement.

In the present summary of the invention, we will now detail more specifically hereinbelow the features of the invention constituting the heart of the present invention, as they are outlined in the claims.

Thus, in accordance with the heart of the invention, there is disclosed an optical test bench for concurrently testing the properties of an electromagnetic wave sensor and at the same time those of an electromagnetic wave emitter, the sensor and emitter mounted close together at a fixed area in space; the test bench comprising: a main frame; mirror means, mounted to said main frame and adapted to come in axial alignment with said sensor and emitter; electromagnetic wave test means, mounted to said main frame about the focal plane of said mirror means; and means for comparing and correlating electromagnetic wave values obtained by said test means with design specifications of the emitter and sensor.

Preferably, said main frame forms part of a casing enclosing said mirror means and test means, and means are further provided to sealingly connect one end of said casing to said sensor and emitter.

Preferably, mirror alignment means are also mounted in said casing to permit orienting the mirror means towards a predetermined focal point.

There should be further included an air recirculating, dehumidifying, and filtering system, connected to said casing, for providing a controlled environment within this casing.

Preferably, said air filtering system screens all macroscopic particles in suspension in the air, advantageously a "class 100" environment system.

Profitably, said mirror means defines a single virtual parabolic reflecting surface, at the end of said main frame opposite said casing one end, and adjustment means to adjust the orientation of said reflecting surface. More particularly, said mirror means may define two parabolic off-axis mirrors having a common virtual parabolic reflecting surface, both mounted at the end of said casing opposite said casing one end, and adjustment means are provided to adjust the position of either one of these two parabolic mirrors relative to the other.

Advantageously, said two parabolic mirrors are collimating mirrors, and said alignment means further enabling adjustment of the position of said parabolic collimating mirrors to bring them to a common focal point.

Said two parabolic mirrors are preferably mounted to a single common rigid mounting plate which forms part of said main frame and about which said adjustment means is operative. Such mounting plate may be U-shaped, and may include a number of longitudinal reinforcing strut members to prevent any displacement of the parabolic mirrors relative to said main frame under the load of said parabolic mirrors or to reduce to the strict minimum thermal expansion retraction play of its constituting material.

It is envisioned that said adjustment means should include: a mirror mounting frame, for each one of said parabolic mirrors; a pivot member, pivotally interconnecting the center of each corresponding parabolic mirror frame to said common mounting plate; and at least three adjustment screw members, each adjustably biasing one peripheral radial section of one said mirror mounting frame toward of or away from said common mounting plate, each screw member being accessible from the exterior of said casing whereby the integrity of the controlled environment obtained within said casing thanks to said air recirculating, dehumidifying, and filtering system, is not threatened.

Said sensors and emitters may be embedded into the housing of an optical device having at least two windows, behind each of which is mounted at least one sensor or emitter; said two parabolic mirrors having a field of view encompassing the electro-magnetic wave beams emitted by said emitters or received by said sensors.

Said optical device housing could be adapted to be operatively positioned on the upper front portion of ADATS ™ vehicles such as: the M113A2, the M3, the SISU, etc . . . ; said optical device housing being adjustable about its horizontal and vertical axes; said casing of the optical test bench having aperture means at one end adapted to register with said optical device housing windows.

Preferably, there is further included means to properly orient the optical test bench relative to said optical device.

Profitably, said aperture means of said casing of the optical test bench, when in operative position, is connected to said optical device by a semi-rigid skirt whereby the combination of said casing and of said optical device constitute an air-tight assembly.

Advantageously, said casing of the optical test bench is movable over ground by means of an external positioner; said air recirculating, dehumidifying, and filtering system being mounted in a box located in said external positioner; said box having at least one air inlet and one air outlet; said casing of the optical test bench having at least one air inlet, and at least one air outlet, wherein an air inlet of the casing is sealingly connected to a corresponding air outlet of said box by a flexible tube, and an air outlet of the casing is sealingly connected to a corresponding air inlet of said closed box by another flexible tube.

Profitably, said external positioner is made of two half-parts, vertically movable relative to each other by elevating means such as scissor-action spreader lever members, said casing being preferably supported by anti-vibration means.

Preferably, said ground displacement means of the external positioner are rollers or an air cushion system; and further including vertically adjustable jack pad members, mounted to the periphery of the base of said external positioner and adjustable from a first limit position, in which said rollers engage the ground, to a second position, in which said rollers clear the ground.

It is envisioned that a control be positioned near the assembly constituted by the operatively interconnected external positioner, optical test bench casing and combat vehicle with its optical device; said control desk connected to the optical test bench casing, via the external positioner, through a coaxial cable. Preferably, said control includes at the minimum: computer means, including a computer, data storage means associated to the computer, a monitor, a keyboard, a printer, and an oscilloscope. Also, said computer means may further include control knobs and displays, for controlling and monitoring the elevating means and further fine displacement means of the optical test bench relative to the external positioner, and also including walkie-talkie means to enable the operator of said control of the optical test bench to communicate with the operator of said optical device of the ADATS TM which is inside the crew compartment of the latter.

Said aperture means of the casing of the optical test bench may include two large apertures or aperture stops made in the corresponding end wall of that casing; further including two aperture stops or shutter panels releasably closing said two large apertures, said shutter panels being movable to a position clearing said two apertures when said skirt is installed in position.

Preferably, said mirror means further includes a collector mirror, mounted by a mounting arm within said casing of the optical test bench intermediate said parabolic off-axis collimating mirrors and said apertures, along the optical path thereof of the parabolic mirrors orthogonally to said wave test means; said collector mirror being inclined so as to fold an electromagnetic wave path coming from said wave test means toward said collimating mirrors, and alternately or concurrently, to fold another wave path coming from said emitter via said collimating mirrors toward said wave test means; said collector mirror being positioned between the virtual axial projections of the whole surface of the two collimating mirrors, so as not to intersect the projections thereof.

Profitably, said mounting arm of the collector mirror includes micrometric screw displacement means, to adjustably displace said collector mirror toward or away from said collimating parabolic off-axis mirrors.

In accordance with an important feature of the invention, said alignment means preferably consist of a periscope alignment system, slidably mounted to a guiding rail which is anchored within said casing exteriorly of said virtual axial projections of the collimating parabolic mirrors, said guiding rail extending between said collector mirror and said apertures.

More specifically, said periscope alignment system may include: an anchor arm, slidably engaged into said guiding rail, a hollow tube transversely pivoted to said anchor arm whereby said hollow tube is capable of rotation as well as translation relative to said collimating parabolic mirrors, a source of phased light anchored to said hollow tube and defining a straight beam extending exactly at the center of the longitudinal axis of said hollow tube, a reflecting mirror anchored into said hollow tube at its end opposite said source of light and defining an acute angle relative to said longitudinal axis of the hollow tube, a beam splitter anchored into said hollow tube between said reflecting mirror thereof and said source of light and parallel to this reflecting mirror and adapted to reflect a fraction of the incident said straight beam and to allow the remainder of the incident said straight beam to pass therethrough to strike said reflecting mirror, said hollow tube having two transverse bores in register with said reflecting mirror and said beam splitter respectively for passage of the corresponding parallel reflected beams; and two beam chopper members, anchored to said hollow tube in respective register with said two transverse bores thereof for pulsing said reflected beams at two different non-harmonic frequencies.

Advantageously, each one of said beam choppers consists of a disc plate having two sector-shaped openings and rotatably driven by a motor. Also, the frequency differential of the two reflected beams pulsed by said two beam choppers may be about 33%. Also, said source of phased light may be a diode laser.

Profitably, one of said wave test means includes a differential blackbody assembly source test, consisiting of: a standard blackbody box having an infra-red beam generator therein and being positioned so that at least one slit made on one wall thereof come to register with the focal point of the two parabolic mirrors, so as to define a simulated infra-red emitting target adapted to be detected by an infra-red sensitive sensor of the optical module via said mirror means. There may be four similar slits on said one wall of the differential blackbody assembly source test box, each slit having a rectangular shape so that the test constitute a four-bar target test. It is envisioned that there would be a number of groups of said four slits, similar in shape but different in relative dimensions, wherein the sensitivity of a sensor in the optical device can be calibrated.

Alternately or concurrently, one of said wave test means could include a boresight test assembly source test, including: a dual light emitter and pyroelectric detector assembly whose optical paths pass through a common pinhole, made on a test surface thereof, via a beamsplitter, the plane of said beamsplitter defining a Brewster angle with each of said optical paths; a first lens being interposed between the pinhole and the beamsplitter, for collimating the light beam from the optical module having engaged the pinhole, and/or for making the light beam coming from said light emitter converge toward the pinhole; a second lens being interposed between said light emitter and the beam splitter, for collimating the light rays of said light emitter about a locus intermediate the light emitter proper and the second lens.

There could be further included in this case a third lens, interposed between the pyroelectric detector and the beam splitter.

Alternately or concurrently, one of said wave test means could include a tracking test assembly source test box, characterized in that it simulates a target which moves along a simulated sky background. One embodiment of this test could include: a glass plate, being transparent to the wave lengths that are used, and to the periphery of which are mounted a number of light emitting diodes (LED) which emit toward a sensor of said optical module; translational motion means, to displace said glass plate within said box; and a diffused light source at the back of said glass plate; wherein a marking is made on the glass plate, so that by moving the latter, the marking appears to be a target on the sky background.

The glass plate could be made of a ZnSe transparent glass material. Also, said LEDs may include: a first type, emitting in the visible bandwidth, for a TV sensor, and a second type, emitting in the infra-red bandwith, for a missile tracking sensor. Also, said marking could be made by an etching at the center of said glass plate.

A second embodiment of the tracking test assembly could include: a lens, anchored to said test box and being transparent to the wave lengths that are used; a variable output light source at the back of a frosted glass plate, so as to emit variable diffuse light; a beamsplitter at the point of convergence of the two axes which are orthogonal to said glass plate and said lens and at about 45 degrees from each one of these axes; and an orthogonal optical scanner, rearwardly of said lens relative to said beamsplitter, said scanner emitting a beam of light scanning the surface of said lens so as to simulate a moving target.

A third embodiment of the tracking test assembly could include a beamsplitter plate which reflects on one side light from a pinhole target-simulating source and is frosted on the other side to diffuse light received from a second source. The plate is rotated and oscillated about two perpendicular plate axes to simulate a target moving on a sky background.

Alternately or concurrently, one of said wave test means could include a laser ranger test assembly source test box. One embodiment thereof could consist of: two pinholes made on one same wall thereof; a LED in register with one of said pinholes and anchored within the box; a switch controlling the latter LED via a time delay network; in register with the other pinhole is spacedly anchored an inclined beamsplitter, interposed between a pyroelectric detector and this latter pinhole; the pyroelectric detector being itself connected to said computer means, for laser pulse analysis; wherein said test box will have to be displaced a first time, to bring said one pinhole in register with the focal plane of said mirror means, and a second time, to bring said other pinhole in register therewith.

In order to avoid damage to the pyroelectric detector, it is envisioned that a beam attenuator pad be provided orthogonally to the laser beam path which passes through the pinhole, so as to enable the beam splitter to reflect toward the attenuator a large fraction of the laser ranger laser beam, leaving only a small fraction to enter the pyroelectric detector.

A second embodiment of laser ranger test assembly could consist of: one pinhole made on one wall thereof; a LED in register with the pinhole and anchored within the box; a pyroelectric detector being connected to said computer means, for laser pulse analysis; two inclined beamsplitters, one in register with the pyroelectric detector and the pinhole, the other in register with the LED; an electro-optical gate means being interposed between the LED and the second beam splitter, wherein the light beam from the LED will be allowed to pass therethrough but not the laser ranger (LR) pulse fraction which has not been reflected by the registering beam splitter; the LED and pyroelectric detector being interconnected by a time delay network.

In such latter embodiment, said electro-optical gate means would preferably consist of a Pockel cell.

Preferably, there would be further included a simulated sun flood lamp source test, consisting of a light source movably mounted to said main frame between a first inoperative position, exteriorly of the optical path of said mirror means, to an operative position facing one aperture stop. Preferably, a cross-hair plate system is removably mounted in front of one parabolic mirror to be seen by the T.V. camera of the eo module, to facilitate alignment of the OTB with the EOM.

Said electromagnetic wave test means could be considered to generally speaking include at least a few testing assemblies each provided with one testing surface mounted within the focal plane of said mirror means, and motion means to precisely displace said testing assemblies testing surfaces within said focal plane for adjustingly and selectively positioning a chosen one of said testing surfaces exactly at the focal point of said mirror means.

A most important feature of the invention, considered independently of the remainder thereof, is to provide a periscope alignment system to enable adjustment of the relative position of two parabolic collimating mirrors so as to make the focal points thereof coincide at a specific spatial area, said system comprising: means to orient each mirror independently of each other; a phased light source and an open periscope tube frame fixedly mounted to the light source coaxially of the optical path thereof; means to displace said periscope tube about an axis parallel to a virtual axis extending through both said collimating mirrors; means to pivot said periscope tube about an axis orthogonal to said virtual axis of the mirrors; said periscope tube member including: a reflecting mirror at one end and a beam splitter interposed between said phased light source and said reflecting mirror, wherein said beamsplitter reflects a fraction of the phased light beam toward one of said parabolic mirrors and said reflecting mirror reflects the remaining fraction thereof toward the other of said parabolic mirrors; and two beam choppers, in respective register with said beamsplitter and said reflecting mirrors, said beam choppers pulsing the two reflected phased light fractioned beams at two different non-harmonic frequencies; said system further including means for comparing and correlating the phased light beam values, after having been pulsed by said beam choppers, with design specifications of the emitter and sensor.

The invention is also directed to a method of aligning two collimating off-axis parabolic mirrors with the use of the previously mentioned periscope Alignment System and of a sensor of the focal plane system. Said method comprises the following steps: (a) rotating the periscope tube to a first position about an axis parallel to the axis of said parabolic mirrors; (b) transversely positioning the periscope tube to bring its reflecting mirror and its beamsplitter in respective register with radially outer and inner sections of a first one of the two parabolic mirrors; (c) firing the periscope laser, causing two spaced parallel laser beams to be directed towards said first mirror and reflected towards a sensor located at the desired focal point of said two mirrors; (d) rotating the periscope tube to a second position substantially normal to said first position; (e) repeating step (c) hereinabove; (f) analysing the data gathered by said sensor; (g) with the results of the analysis of step (f), effecting a coarse adjustment of the position of said first parabolic mirror relative to said main frame with said adjustment means; (h) transversely positioning for a second time said periscope tubing to bring its reflecting mirror and its beamsplitter in respective register with the sidewisely radially outer and inner sections of the second one of said two parabolic mirrors; (i) repeating steps (c) to (g) hereinabove but with respect to said second parabolic mirror; (j) transversely positioning for a third time said periscope tubing to bring its reflecting mirror and its beamsplitter in respective register with the sidewisely radially inner sections of the corresponding first and second said parabolic mirrors; (k) repeating steps (c) to (f) hereinabove but with respect to both parabolic mirrors; and (l) with the results of the analysis of step (k) hereinabove, effecting a fine adjustment of the position of both the first and second parabolic mirror relative to each other with said adjustment means.

Alternately, the invention could be said to consist of a method for testing the properties of an electromagnetic wave sensor, said method requiring the use of an optional test bench comprising: a main frame; mirror means, mounted to said main frame and adapted to come in axial alignment with said sensor; electromagnetic wave test means, mounted to said main frame about the focal plane of said mirror means; and computer means, for comparing and correlating electromagnetic wave values obtained by said test means with specification values; said wave test means including a tracking test assembly, characterized in that it simulates a target which moves along a simulated sky background, this test including moving means, to move a target simulating light spot in a plane; and a broad bandwidth diffuse light source, mounted at the back of said light spot relative to the optical path of said sensor and whose candle light output is controlled by a control means; said method comprising the following steps: (a) alighting said light spot and said diffuse light source; (b) actuating said moving means; and (c) verifying at least twice the sensitivity of said sensor to said light spot and to said diffuse light source while varying the candle light output of said diffuse light source with said control means.

Alternately again, the invention could be said to consist of a method for sequentially testing the properties of an electromagnetic wave sensor and the properties of an electromagnetic wave emitter, said method requiring the use of an optical test bench comprising: a main frame; mirror means, mounted to said main frame and adapted to come in axial alignment with said sensor and emitter; electromagnetic wave test means, mounted to said main frame about the focal plane of said mirror means; and computer means, for comparing and correlating electromagnetic wave values obtained by said test means with specification values; said wave test means including a laser ranger test assembly consisting of; a casing; a LED in said casing for directing radiation towards said focal plane; a switch, to control the latter LED via a time delay network; a pyroelectric detector in said casing and being itself connected to said computer means and sensitive to radiation received at said focal plane; and motion means to displace said casing to displace said diode and said detector along said focal plane; said method comprising the following steps: (a) positioning with said motion means the test assembly casing to bring said detector exactly at the focal point of said mirror means; (b) alighting said emitter for emission of infra-red wavelength radiations; (c) analysing the physical data obtained by said pyroelectric detector with said computer means; (d) correlating with said computer means specification data with the data obtained by said pyroelectric detector; (e) adjusting the time value of said delay network correspondingly with said data correlated in step (d) hereinabove; (f) positioning with said motion means the test assembly casing to bring said LED exactly at the focal point of said mirror means; (g) actuating said diode alighting switch; and (h) verifying the data obtained by said sensor.

Alternately still again, the invention could be said to consist of a method for concurrently testing the properties of an electromagnetic wave sensor and at the same time the properties of an electromagnetic wave emitter, said method requiring the use of an optical test bench comprising: a main frame; mirror means, mounted to said main frame and adapted to come in axial alignment with said sensor and emitter; electromagnetic wave test means, mounted to said main frame about the focal plane of said mirror means; and computer means, for comparing and correlating electromagnetic wave values obtained by said test means with specification values; said wave test means including a laser ranger test assembly consisting of: a casing; a LED in said casing for directing radiation towards said focal plane and in register with the focal point of said mirror means; a pyroelectric detector in said casing and being itself connected to said computer means and sensitive to radiation received at said focal plane; a beamsplitter mounted in front of said LED with respect to the optical path of said sensor and emitter and adapted to reflect at least a fraction of the laser beam from said emitter toward said pyroelectric detector; a Pockel cell being interposed between the LED and the beam splitter; the LED and pyroelectric detector being interconnected by a time delay network; said method comprising the following streps: (a) alighting said emitter for emission of infra-red wavelength radiations; (b) analysing the physical data obtained by said pyroelectric detector with said computer means; (c) correlating with said computer means specification data with the data obtained by said pyroelectric detector; (d) alighting said LED automatically through said computer means; (e) verifying the data obtained by said sensor.

Alternately, the present invention could be said to consist of a method for concurrently testing the properties of an electromagnetic wave sensor and at the same time the properties of an electromagnetic wave emitter, said method requiring the use of an optical test bench comprising: a main frame; mirror means, mounted to said main frame and adapted to come in axial alignment with said sensor and emitter; electromagnetic wave test means, mounted to said main frame about the focal plane of said mirror means; and computer means, for comparing and correlating electromagnetic wave values obtained by said test means with specification values; said wave test means including a boresight test assembly consisting of: a casing; a broad bandwidth source lamp anchored to said casing and whose optical path is within said focal plane; a pyroelectric detector, anchored to said casing and being itself connected to said computer means and in register with the focal point of said mirror means; a beamsplitter anchored to said casing at the converging point of the optical paths of said detector and lamp, the plane of said beamsplitter defining a Brewster angle with each of said optical paths; a first collimating lens being anchored to said casing between said focal plane and said beamsplitter, a second collimating lens being anchored to said casing between said lamp and said beamsplitter; said method comprising the following steps: (a) alighting said emitter for emission of electromagnetic wave radiations toward said wave test means; (b) alighting said broad bandwidth source lamp automatically through said computer means, while said pyroelectric detector still continues to receive said emission of electromagnetic wave radiations; (c) correlating the data obtained by said sensor with data from the pyroelectric detector, concurrently with analysis and correlation of the latter data with respect to specification data thanks to said computer means.

Again and alternately, the present invention may consist in a a method for testing the properties of an electromagnetic wave sensor, said method requiring the use of an optical test bench comprising: a main frame; mirror means, mounted to said main frame and adapted to come in axial alignment with said sensor; electromagnetic wave test means, mounted to said main frame about the focal plane of said mirror means; and computer means, for comparing and correlating electromagnetic wave values obtained by said test means with specification values; said wave test means including a differential blackbody test assembly consisting of: a closed box; an infra-red generating source, mounted within said box; one wall of said box being within said focal plane of said mirror means and having a number of groups of slits, the slits being of different size but of similar shape from group to group; and motion means, to displace said box relative to said main frame whereby said one wall thereof is displaced within said focal plane so that one of said groups of slits be selectively positioned exactly at the focal point of said mirror means; said method comprising the following steps: (a) engaging said motion means to position said closed box to bring a selected first one of said groups of slits at said focal point of the mirror means; (b) engaging said infrared generating source for emission of infra-red radiations through said slits toward said sensor; (c) gathering data obtained by said sensor; (d) engaging said motion means for at least a second time to position said closed box to bring a selected different other one of said groups of slits at said focal point of the mirror means for each time said motion means is engaged; (e) gathering data obtained by said sensor; (f) correlating the data obtained in steps (c) and (e) hereinabove by feeding same into said computer means.

The embodiments of the invention disclosed in the drawings and in the specification are merely preferred ones, and it should be understood that only the claims will limit the scope of the protection afforded by the present invention.

BRIEF DESCRIPTION OF THE DRAWINGS

FIGS. 7 and 8 are vertical transverse sectional views of the optical test bench taken along lines 7—7 and 8—8 respectively of FIG. 6, the sun flood lamp system being removed from FIG. 7 for clarity of the view;

FIG. 9 is an enlarged partly sectional plan view of the laser and periscope system for alignment of the two front parabolic mirrors (LAPS, for laser alignment periscope system) in accordance with the teachings of the embodiment of the invention;

FIG. 10 is an enlarged plan view of one laser beam chopper of the laser alignment periscope system, taken along line 10—10 of FIG. 9;

DETAILED DESCRIPTION OF THE INVENTION

Figure 1:
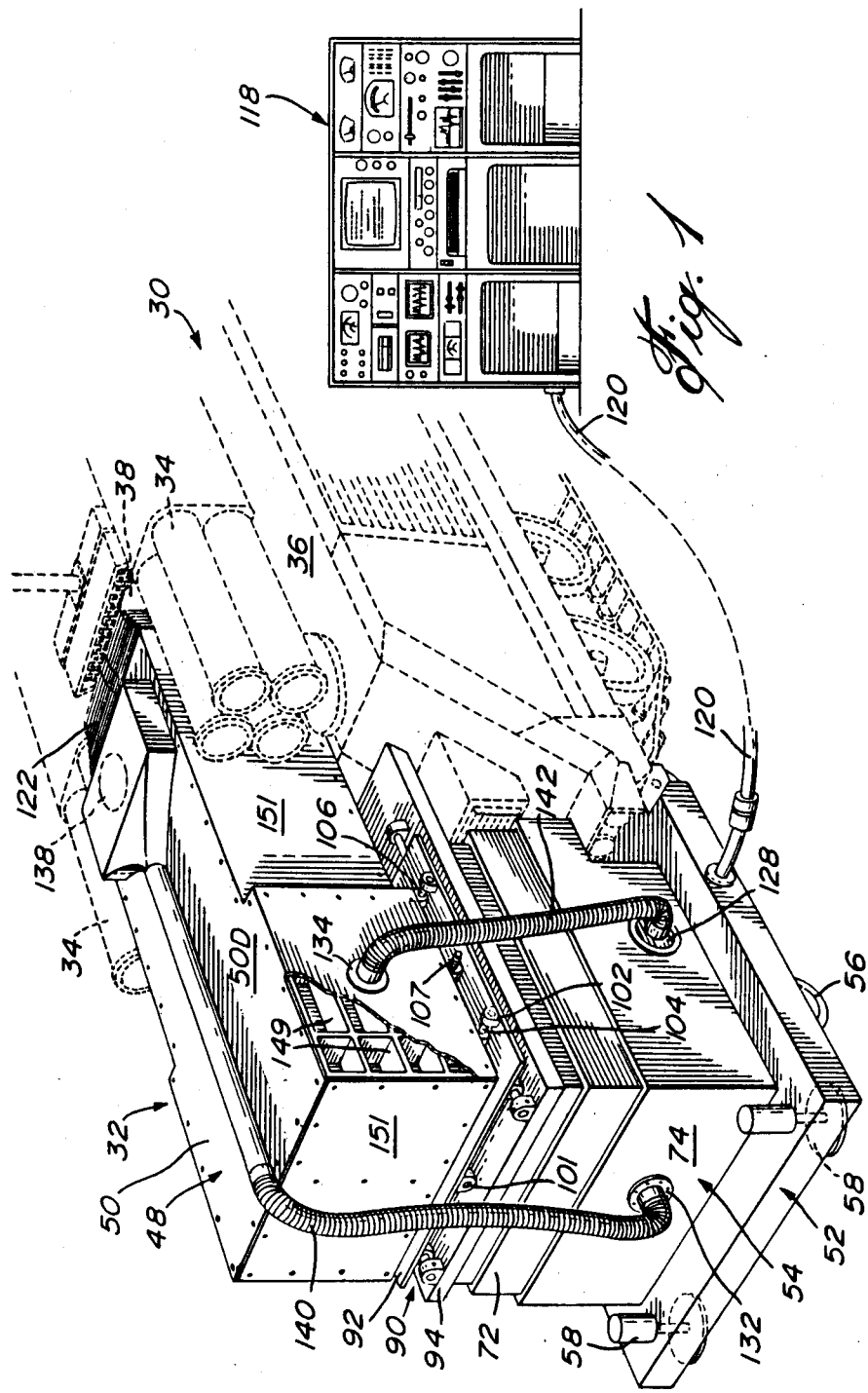
FIG. 1 is a downwardly looking perspective view of the front portion of an ADATS TM vehicle in dotted lines, provided with a dual emitter/sensor optical module also in dotted lines, and with an optical test bench apparatus according to a preferred embodiment of the invention in operative testing position and shown connected to a separate computer control desk.
Figure 2:
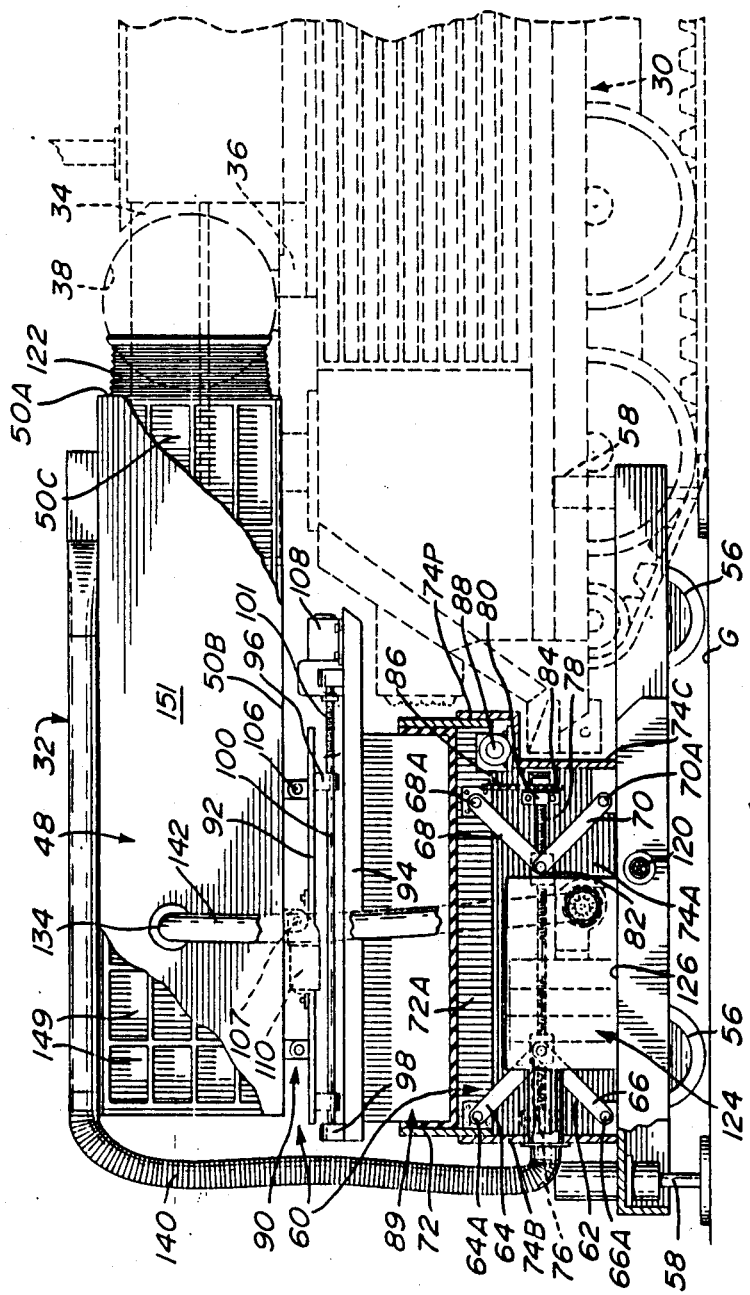
FIG. 2 is a vertical partly broken side elevational view of the front section of the ADATS TM vehicle in dotted lines, and of the embodiment of optical test bench apparatus shown in FIG. 1, with the external positioner shown in vertical side sectional view.

In FIGS. 1 and 2 is illustrated an automotive allterrain combat vehicle of the ADATS ™ 30 type, against which is operatively and removably positioned a front apparatus 32 constituting the heart of the invention and detailed below. Missile cannisters 34 are supported on the side portion of the front top wall 36 of the vehicle 30, while an optical module 38 is mounted between the cannisters 34. Module 38 and cannisters 34 are operated by a single person from a control desk (not shown) inside the crew compartment of the vehicle 30.

Module 38 is barrel like, having on one side of its curved face four windows 40, 42, 44 and 46 (see FIG. 3) for the passage of electromagnetic waves. Behind the diametrally largest window 40, there is mounted a forward looking infra-red (FLIR) sensor, window 40 being located proximate one end 38A of the module 38 (the FLIR sensor is sensitive to infra-red radiations). Behind the imtermediately dimensioned window 42, there is mounted a missile guidance laser of the module 38. Behind the smaller window 44, there is mounted a sensor of the T.V. (visible) type (a T.V. camera) and also an emitter in the laser rangefinder mode of the module 38. Behind the other smaller window 46, there is mounted a missile tracker sensor used for missile tracking operations of the module 38 ( as suggested in FIG. 4 of the drawings, with the missile designated as M). Windows 42 to 46 are grouped in a virtual circle near the other end 38B of the module 38. Module 38 can rotate about vertical axis y—y and also about horizontal axis x—x. Module 38 and missile cannisters 34 are operated by a first person from a console (not shown) in the crew compartment of the vehicle 30.

As such, vehicle 30 or module 38 do not form part of the present invention; the vehicle could e.g. be replaced by any other similar vehicle which need not necessarily be terrestrial, and could even be replaced by an appropriate module support forming part of a factory testing environment.

The front apparatus 32 consists of two main parts: an optical test bench 48, enclosed in an elongated box-like casing 50 and designed to be temporarily mounted at its open "rear" end 50A in register with the module 38; and a lower positioner 52, also enclosed in a box-like frame 54, for carrying casing 50 and which is moved on the ground G forwardly of the vehicle 30 by wheels 56 or by an air cushion means. The external positioner 52 can be lifted over ground G by vertically-adjustable jack pads 58, wherein the wheels 56 clear the ground G and the external positioner 52 can thereby be immoblizied in position. Only the front portion of the casing 50 is supported by the frame 54; we will see that the center of gravity of the optical test bench 48 is within the front portion of casing 50, whereby casing 50 can be easily supported in cantilever fashion.

In accordance with the invention, it is paramount that the optical test bench 48 be precisely aligned with respect to the module 38, and therefore control means 60 are provided for adjustment of the position thereof. Such control means 60 may be as shown in FIG. 2, including: elevation control means 62, consisting of two pairs of scissor-action power-operated spreader levers 64, 66, 68, 70 installed within the frame 54 of the positioner 52. More particularly, each one of the four levers 64–70 is pivotally connected at one end to four opposite corners of the positioner frame 54, at 64A, 66A, 68A and 70A respectively, about a substantially common vertical plane. Pivotal axles 64A, 68A are mounted to the side walls 72A of an upper half frame 72 of main frame 54, which is vertically movable relative to a lower half frame 74 by slidably engaging a top opening 74P in half frame 74; and pivotal axles 66A, 70A are mounted to the side walls 74A of the lower half frame 74. The two front levers 64–66 are pivotally interconnected at their inner ends to a slider block 76 threadedly engaged by an elongated threaded rod 78, which is itself rotatably mounted in horizontal position to two opposite brackets 80 anchored to the front and rear walls 74B, 74C respectively of the lower half frame 74 of the positioner, over lower pivot axles 66A, 70A. The two rear levers 68, 70 are similarly pivotally interconnected at their ends to another slider block 82 threadedly engaged by rod 78. Rod 78 consists of two half sections defining two opposite thread pitches, wherein upon rotation of the rod, slider blocks 76 and 82 will move either toward each other or away from each other, which is to say, will induce levers 64–70 to vertically displace half frame sections 72–74 relative to each other. Rod 78 may be rotated by any suitable means, e.g. manually or power driven through an integral end gear 84 entrained by chain 86 connected to the drive shaft of a motor 88 anchored to the side walls 74A near the rear wall 74C of half frame 74.

Anti-vibration dampening means 89 of any conventional make such as shock absorber members are supported by the upper half frame 72 of the positioner 52, to ensure that the optical test bench 58 will be spared undesirable vibrations.

The control means 60 also include means to adjust the longitudinal and the lateral position of the casing of the optical test bench 48 relative to positioner 52, namely a translational table 90 supported on top of dampening means 88. Table 90 would include top and bottom plates 92, 94. Top plate 92 includes downturned ears 96, and bottom plate 94, upturned ears 98 adapted to come in horizontal front to rear register with corresponding ears 96. Longitudinal guide rods 100 fixed to ears 98 are slidingly engaged by ears 96. Similarly, top plate 92 will include upturned ears 102, and the flooring 50B of the optical test bench casing 50, downturned ears 104 adapted to come in horizontal sidewise register with corresponding ears 102, and transverse rods 106 are secured to ears 102 and are slidably engaged by ears 104. Top plate 92 is moved forwardly and rearwardly by a central threaded rod 101 driven by a motor 108, and screwed in a nut (not shown) fixed to the underside of plate 92. A similar arrangement including a transverse threaded rod 107 rotated by a motor 110 adjusts the transverse position of casing 50 relative to plate 92. In practice, the longitudinal fine adjustment means 96, 98 100, 101, 108 are dispensed with, and the transverse fine adjustment means 102, 104, 106, 107, 110 are retained. Also, dampening means 89 are preferably mounted between plates 92 and casing 50.

It is to be noted that when it is desired that the optical test bench 48 be mounted in register with the module 38 on the vehicle 30, the vehicle 30 will have to be motionless (i.e. lifted by the jack pads 58), both during installation thereof with the positioner 52 and during testing procedures, detailed later.

The positioner 52 bearing the optical test bench 48 is moved proximate to the vehicle 30, so as to bring the rearwardly projecting free portion of the casing 50 within the cavity of the ADATS ™ vehicle 30 defined betwen the missile cannisters 34. Then one operator enters into the ADATS TM vehicle 30, to become the operator thereof which inlcudes controlling the rotation of the module 38 about its horizontal and vertical axes. The ADATS TM operator looks into the T.V. camera monitor (not shown, since within the vehicle 30) to verify the axial alignment of the four windows 40–46 of the module 38 with a pair of parabolic off-axis mirrors 112, 114, (detailed later) mounted to the inner face of the front wall 116 (also detailed later) of the optical test bench casing 50, with one mirror 112 adapted to come in register with large window 40 while the other mirror 114 comes in register with the other wiwndows 42–16. The alignment procedure is facilitated through means to be detailed later. The ADATS TM operator instructs other personnel, through a walkie talkie or the like, to slightly rollingly displace the positioner 52 manually to provide a "finer" positional adjustment (that is, axial alignment of the windows 40–46 through visual inspection with his monitor) relative to the "coarse" preliminary adjustment when the personnel had to displace the positioner in front of the ADATS TM vehicle 30.

Figures 30, 31:
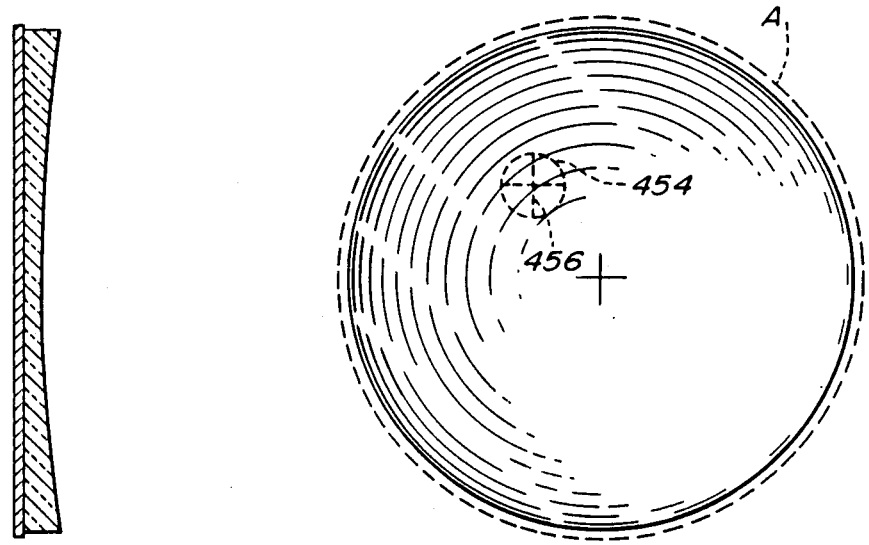
FIG. 30 is a view similar to that of the left-hand portion of FIG. 18, but for a second embodiment of mirror means including a single parabolic mirror.
FIG. 31 is a view similar to that of FIG. 13, but showing the single parabolic mirror of FIG. 30.

Mirrors 112, 114 could be replaced by a single, larger, spherical mirror 600 (FIGS. 30, 31), but then substantial spherical aberations can be expected; alternately, mirrors 112, 114 could be replaced by a single parabolic mirror, but then the weight thereof would be so high as to constitute a mechanical problem for the optical test branch.

The advantage of their being two parabolic off-axis mirrors is that, as will be obvious later on, if the operator needs to use only a given section of the parabolic surface of the mirror means 112, 114, then only one mirror 112 or 114 needs to be used.

At this point, the positioner 52 will have to be immobilized relative to the ground by engaging the jack pads 58 so that the rollers 56 clear the ground G.

Again the monitoring of the azimuth and elevational control means of the module 38 may be required, and this means a third adjustment step.

Then, a fourth adjustment step will be effected by having the second person operate the control means 60, still under instructions from the ADATS TM operator. Control means 60 could be monitored via an optical test bench control desk 118, which is separate from parts 30, 48 or 52 and which would be connected to the lower half frame 56 of the positioner 52 through a suitable coaxial line 120, as illustrated in FIG. 1.

We will see later on that these four positional adjustments of the optical test bench 48 relative to the module 38 will be followed by two further steps for the alignment of the parabolic mirrors 112, 114 relative to each other.

After these four preliminary positional adjustment procedures, the front open wall 50A of the optical test bench casing 50 should be as close as possible to the module 38, wherein an air-tight connection is made possible between module 38 and casing 50 (which is closed except for its front open wall 50A) thanks to use of a flexible skirt 122. Skirt 122 is anchored to the front wall 50A of casing 50 and is made from a suitable semi-rigid material (which may be elastomeric) so as to releasably sealingly engage the cross-sectionally C-shaped exterior half-body of the barrel-shaped module 38.

According to an important feature of the invention, there should be provided an air recirculating, dehumidifying, and filtering system 124 for the air entering within the casing 50 of the optical test bench 48. This preferably takes the form of a small closed box 126, mounted within the lower half frame of the positioner 52. Box 126 has two air inlets 128 about the side walls of the lower half of the positioner 52, and one air outlet 132 about the front wall of the lower frame thereof. Similarly, the optical test bench casing 50 includes two air outlets 134, 136 (FIG. 5) on the front portion of the side walls 50C thereof, and one air inlet 138 on the rear portion of the top wall 50D of casing 50. Air outlet 132 should be connected to the air inlet 138 sealingly by a first accordion-like elastomeric (flexible) tube 140; while each air inlet 128 is connected to a sidewisely registering air outlet 134, 136 (that one, which is on the same side) sealingly by second and third similar accordion-like elastomeric (flexible) tubes 142, 144. Advantageously, inlets 128, 130 and outlets 134, 136 pass through a common vertical plane.

Hence, physical as well as chemical contaminants are screened, as well as the level of ambient light entering therein (light pollution), wherein substantially constant TPN conditions (temperature-pressure-volume) are established into the optical test bench 48. Hence, OTB 48 will constitute a miniaturized, self-contained laboratory by itself. Moreover, casing 50 will also permit to match the lowest level of laser safety regulations during the optical module testing.

Figure 5:
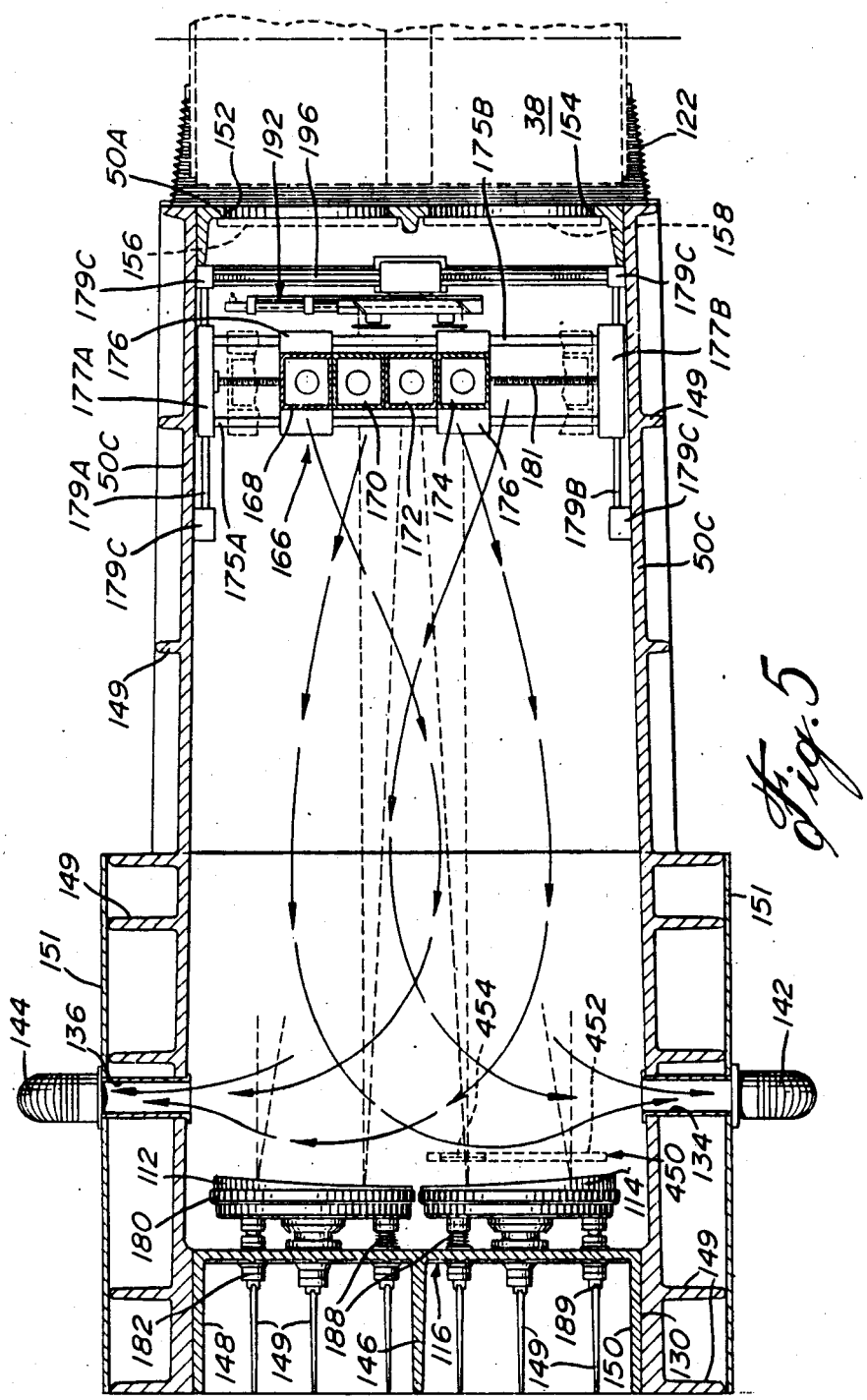
FIG. 5 is a top plan view of the embodiment of optical test bench with its front cover removed and positioned against the optical module partly shown in dotted lines.

Looking now at FIG. 5 et seq. of the drawings, casing 50 is shown to have a front aperture 130 being frictionally lockingly sealingly closed at the back by a mounting plate 116 constituting the front wall thereof, and from which projects an intermediate reinforcing flange 146 and two opposite side flanges 148, 150. The front and side walls of the casing 50 should also include a plurality of small reinforcing transverse ridges 149, to provide a sturdy construction therefor. Exterior flat covering plates 151 are fixedly mounted against said ridges 149. Two rounded apertures 152, 154, are made into the rear wall 50A of casing 50 and are designed to come in register with window 40 and windows 42–46, respectively, of the optical module 38. Round apertures 152, 154 are normally closed by two aperture stop shutters 156, 158, to prevent ingress of contaminating dust et al into the casing 50 during transport of the optical test bench 48 (before connection to the module 38); however, when the skirt 122 has been engaged in position between the module 38 and the rear end of casing 50, shutters 156, 158 are temporarily moved out of the field of view, by retraction through e.g. top sealed slits (not shown). These shutters 1568 158 preferably are transparent glass plates, which may be slidingly inserted in appropriate grooves (not shown) made about the plane of the apertures 152, 154 along the side walls of the casing 50. Hence, during the hereinabove detailed four preliminary positional adjustment steps of the optical test bench 48 relative to the module 38, the transparent shutters 156, 158 are engaged ion their closing position.

Figure 3:
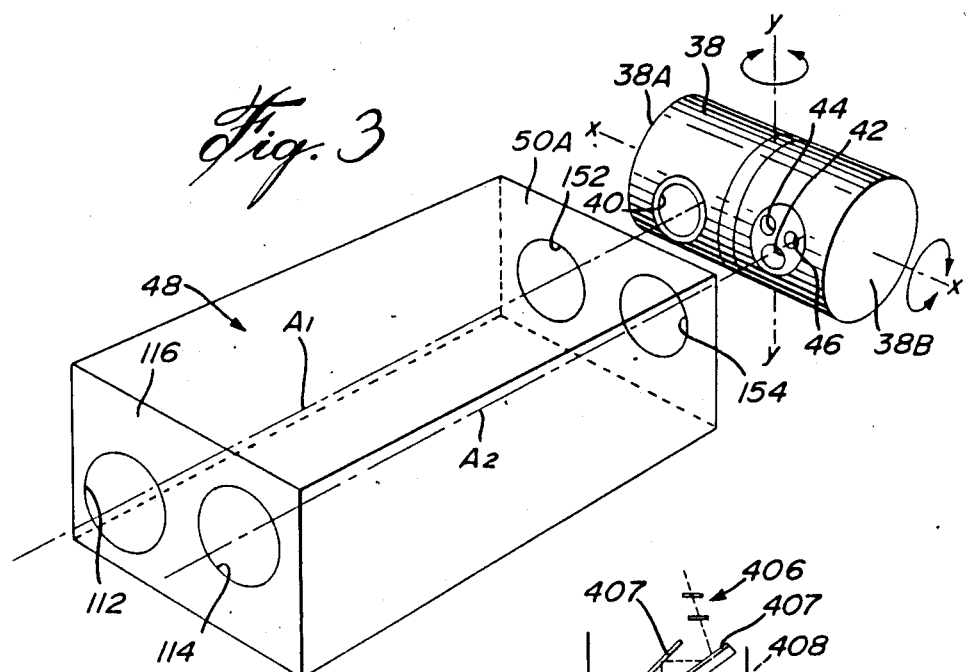
FIG. 3 is a schematic view of the optical test bench casing and of the optical module in their operative relative positions, in order to show how the windows of the latter register with the rear apertures and front (inner) parabolic mirrors of the former.
Figure 4:
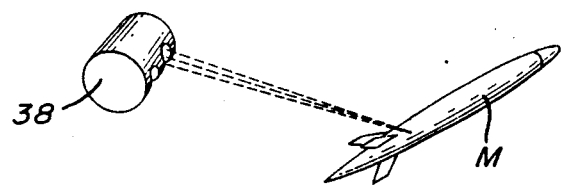
FIG. 4 is a schematic view of the optical module when operated to guide a missile.

As shown schematically in FIG. 3, the center of window 40 of the module 38 defines with the center of the circular area defined by the groups of three windows 42–46 thereof a virtual line which makes small acute angle relative to a horizontal plane; similarly, the centers of the rear apertures 152 and 154 of the optical test bench 48 are interconnected by a virtual line having exactly the same slope as that of the former said virtual line, and still similarly, the centers of the two parbolic mirrors 112, 114 are interconnected by a virtual line having exactly said same slope. Thus, mirror 122B aperutre 152, and window 40 are designed to be aligned along a first common axis A1; and similarly, mirror 114, aperture 154, and the circualr area defined by the three windows 42, 44 and 46 are designed to be aligned along a second common axis A2 parallel to the first axis A1.

The optical test branch 48 thus completes the laterally-spaced mirrors 112, 114, of the off-axis parabolic type, mounted to the inner side of the mounting plate 116. Mirrors 112, 114 should be made of a thermally neutral glass material, such as low thermal expansion ceramic glass, and the reflecting surface thereof made of a highly-reflective coating; such coating may be an aluminum coating overcoated with a protective siliconmonoxyde alloy. A small collector flat mirror 162 is adjustably anchored to the rear portion of the casing 50 by an upright mounting post 163, at precisely 45° to the plane of front mounting plate 116, mirror 162 horizontally registering with the spacing bewteen front parabolic mirrors 112, 114. The mounting post 163 is carried by a transversely extending rail 165 via an integral bottom slider 163A, the rail 165 anchored at both ends to the side walls 50C of the optical test bench (OTB) casing 50. Rail 165 is parallel to and overlies the flooring 50B.

Collector mirror 162 is adapted to fold the path of electromagnetic waves inclusing light rays from an emitter source (see below), and its mounting post 163 will include known micrometric displacement screw means 164 for enabling a small front to rear displacemnt of the collector mirror 162 relative to the casing 50. Heat exchanger means, not shown, may be provided to dissipate the heat generated by the powerful laser beams (from emitters behind one or more of the windows 40-46 of the optical module 38) striking collector 162.

A focal plane system 166 is further provided, being mounted to the casing proximate the top wall 50D thereof, in substantially vertical (overlying) register with collector mirror 162. The focal plane system 166 includes four electromagnetic wave testing assemblies in boxes denoted 168, 170, 172 and 174 which are all fixedly successively interconnected in pairs, and the two end boxes 168, 174 (which could also be boxes 170, 172) are mounted to two substantially U-shaped slider frames 176. The test boxes 168-174 are located about an upturned extension 178 of the casing top wall 50D. These sliders 176 have front and rear bores 176A, 176B which are slidingly engaged by two corresponding rods 175A, 175B. Rods 175A, 175B are fixedly connected at one end to a common sleeve 177A, and at the other end to a second common sleeve 177B. Each sleeve 177A, 177B is slidably engaged by a corresponding front to rear extending rod 179A, 179B, which latter rods are screwed to the OTB casing opposite side walls 50C by large brackets 179C. The plane passing through rods 175A–175B and 179A–179B is parallel to the plane of the OTB casing flooring 50B.

Hence, thanks to these sliders 176 and 177A–177B, the focal plane system test boxes 168-174 are designed to be displaced for translational free movement, both transversely to the optical axes of parabolic mirrors 112, 114, and longitudinally of this optical axis.

Figure 6:
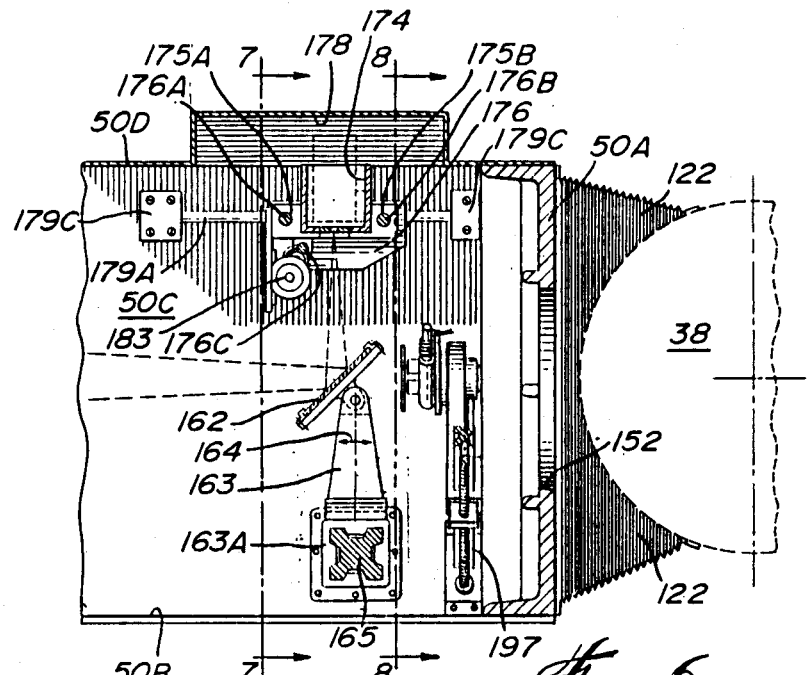
FIG. 6 is an enlarged vertical longitudinal sectional view of the rear portion of the embodiment of optical test bench apparatus shown in FIG. 1, together with the optical module shown in phantom lines and connected to the optical test bench by the air-tight skirt.
Figure 7:
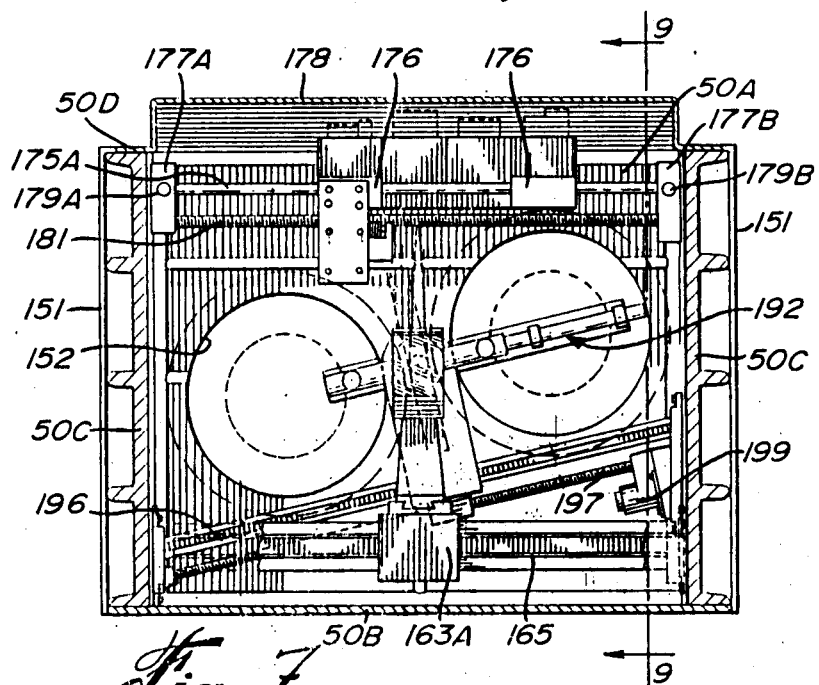
Figure 23:
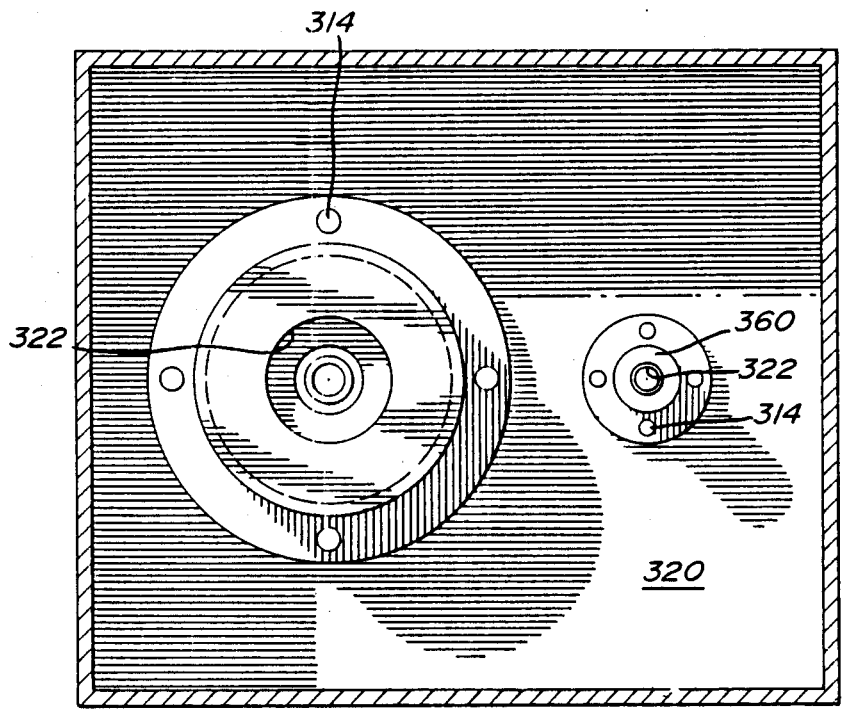
FIG. 22, and FIG. 23 on the seventh sheet of drawings, are cross-sectional views taken respectively along lines 22—22 and 23—23 of FIG. 21.
Figure 15:
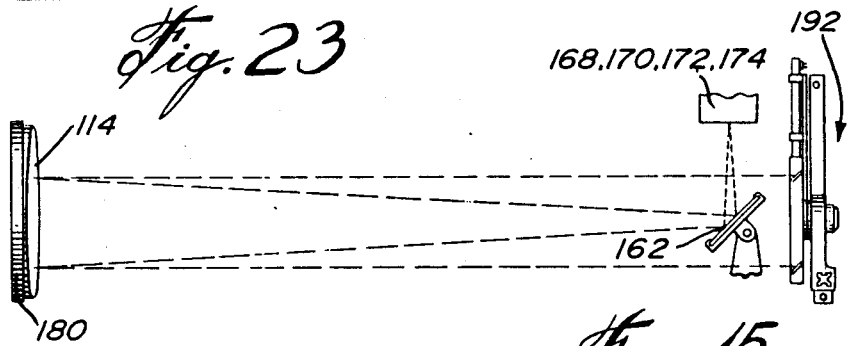
FIG. 15, on the seventh sheet of drawings, is a semi-schematic side elevational view of the optical test bench of the invention, showing the laser alignment periscope system positioned to vertically align a parabolic mirror.
Figure 11:
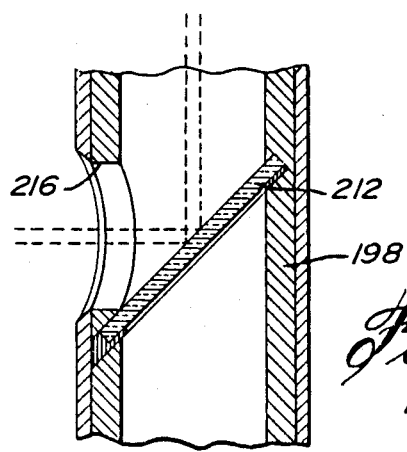
FIG. 11 is a still enlarged view of a portion of the tube of the laser alignment periscope system, showing how the beam splitter is anchored into the tube of the periscope of FIG. 7.

Sliders 176 may include a lower front ear 176C, having a threaded transverse bore threadedly engaged by an elongated threaded rod 181. Rod 181 is rotatably anchored to the side walls 50C of the casing 50, extends below the plane of rods 175A et al, and may be entrained in rotation by a motor 183 (FIG. 6) anchored to one slider 176, for power driven control of the transverse displacement of the boxes 168-174.

However, other means to displace the four testing boxes 168-174 are envisioned, including magnetic levitation means, by a pneumatic cylinder controlled by actuaating means, or by an electronic speed control and closed hydraulic circuit.

Each one of the test boxes 168-174 will be detailed later.

Figure 12:
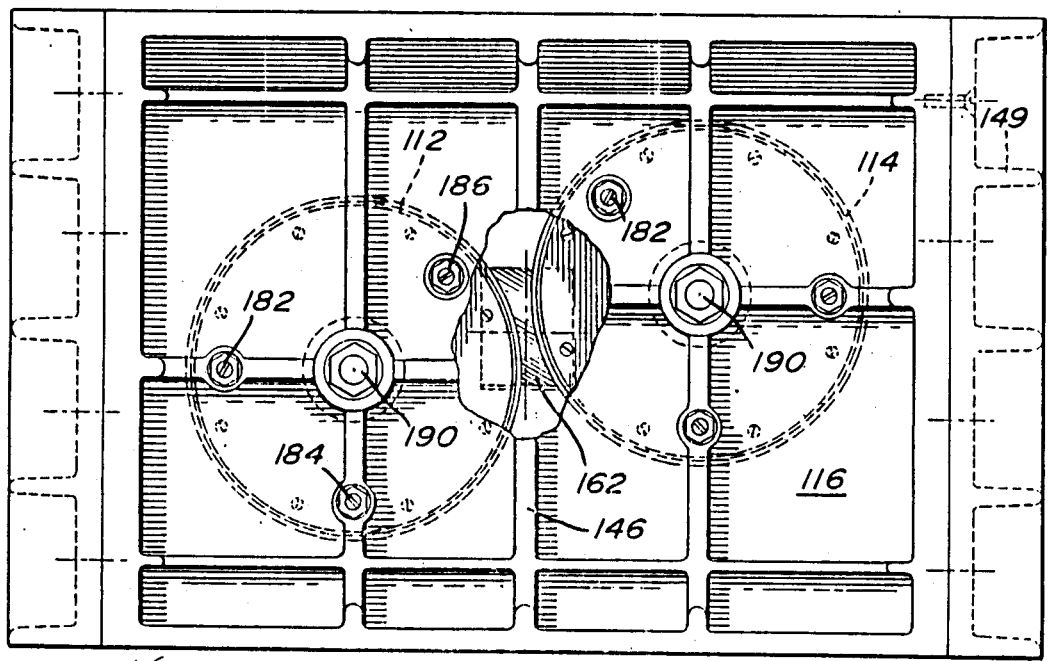
FIG. 12 is an end elevation of the front end wall on which the two parabolic off-axis mirrors are mounted, particularly showing their relative orientation, the front end wall being centrally broken to show part of the mirrors and also the folding mirror.
Figure 18:
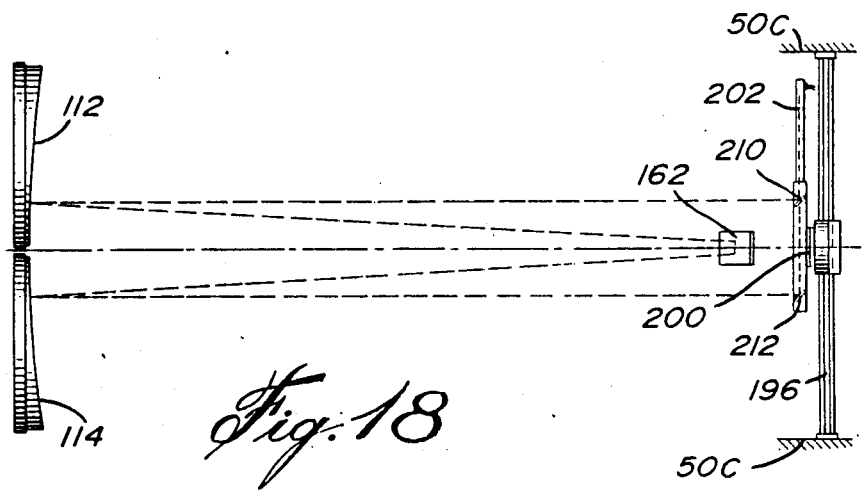
FIGS. 16, 17 and 18 are partly schematic top plan views suggesting how the laser alignment periscope system is operated, but more specifically sequentially showing respectively the three steps involved in the horizontal alignment of the front parabolic mirrors.
Figure 17:
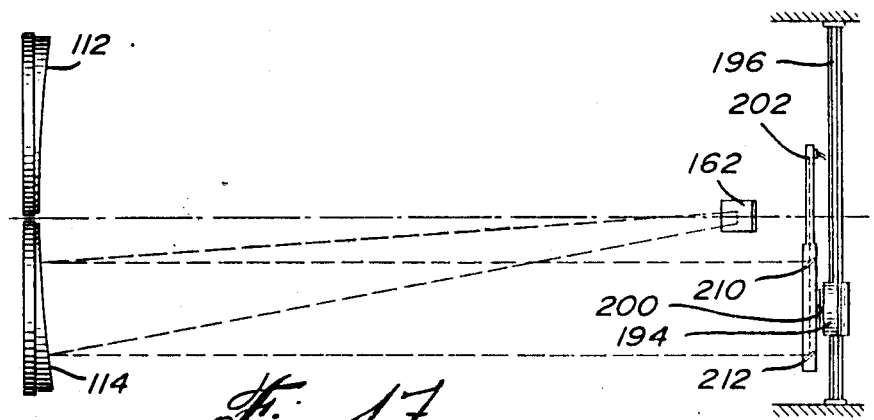
Figure 16:
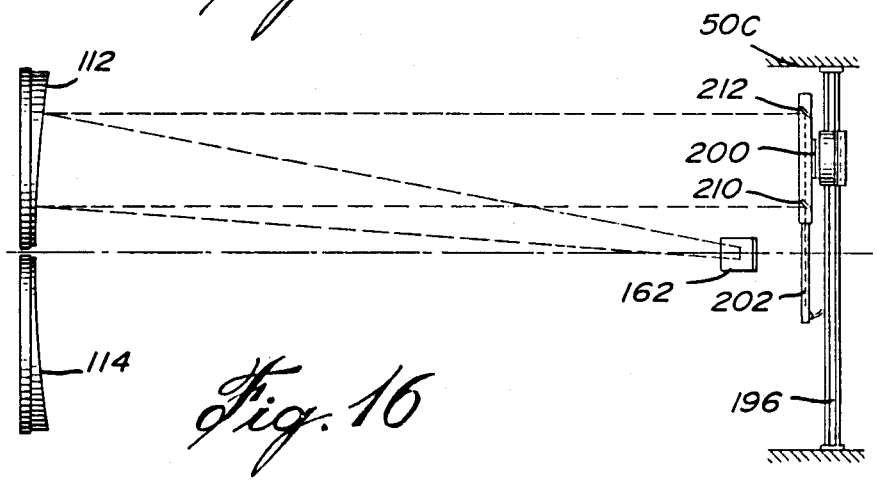

In accordance with the strict requirements of the invention, the two rear parabolic mirrors 112-114 must be exactly aligned in such a way that their commpn focal point coincide with a selected area of the focal plane system 166. Hence, the need for very firmly anchoring the two parabolic mirrors 112, 114 to the front mounting plate 116, so as to ensure minimum mechanical stress and no relative play thereof due to environmental thermal gradients. More particularly, each mirror 112, 114, is enclosed in a separate rigid mounting frame 180 (FIG. 5), each of the latter frames being connected to the front mounting plate 116 by at least three bolt and nut screw assemblies 182, 184 and 186 (see also FIG. 12) to adjustably relatively secure the mirrors 112, 114 relative to the OTB casing 50. High resiliency coil springs 188 are mounted around some of the bolts 184, and a large pivot member 190 is mounted centrally of frames 180, 182 and to the front mounting plate, to allow manual adjustment of relative angular positioning of the mirrors 112, 114. Noteworthy, such adjustment may be effected from the exterior of the casing 50, with the use of a screwdriver or the like tool engaging outer end transverse slits 189 of the bolts 182, 184, 186; hence, such adjustment of the position of the mirrors can be effected while the controlled environment conditions within the OTB casing remains unchanged (are not altered).

To know exactly how much screwing of bolts 182, 184, 186 is needed, adjustment means are provided consisting of a laser alignment periscope system 192 (FIGS. 8-9 et seq). This laser alignment periscope system or LAPS 192 includes an elongated support arm 194 transversely mounted at one end to a rail 196. Rail 196 is anchored to the side walls 50C of the casing 50 to be parallel to the virtual line connecting the centers of the two parabolic mirrors 112, 114 (or of course of the two rear casing apertures 152, 154), and extends below the lower section of the periphery of the casing rear apertures 152, 154. An extension block 195 downwardly depending from the bottom end of arm 194 includes a threaded bore 195A being engaged by an elongated threaded rod 197. Rod 197 is rotatably anchored to the casing side walls 50C, parallel to rail 196 and below the latter. Rod 197 may be entrained in rotation by an electric motor 199 or the like, the latter anchored to one side wall 50C, whereby block 195 constitutes a slider for controlled displacement of the periscope arm 194 transversely relative to the optical axes of the parabolic mirrors.

Laser alignment periscope system 192 is positioned between the collector mirror 162 and these rear wall apertures 152, 154. A large tube 198 is transversely pivotally mounted at 200 to support arm 194, for pivotal (possibly electrically power driven through an electric motor 200A) action about a horizontal axis (i.e. parallel to casing flooring 50B). To one end of the tube 198 is anchored a diode laser tube 202, defining an optical path 201 passing through a beam expander 203. It is important that tubes 198 and 202 be exactly coaxial, and to ensure that this requirement is met, tube 198 includes an extension arm 204 having transverse brackets 206 designed to grip the laser tube 202. Also, the top end of arm 194 includes a threaded bore 194A, for sliding engagement of a guiding rod 205 anchored at both ends to the side walls 50C and parallel to rod 197 and well above the top peripheral section of the proximate rear casing apertures 152, 154.

Hence, the periscope arm 194 is transversely slidable substantially between the two casing side walls 50C, while the laser tube 202 and associated periscope tube proper 198 are pivotable relative to the anchoring arm 194 about a plane parallel to the latter.

A beam splitter 210 is interposed along an optical axis between the laser tube 202 and a mirror 212, the splitter and mirror being anchored to tube 198 (which is preferably made of INVAR (a trademark)), with the beam splitter 210 and mirror 212 being parallel to each other and each inclined by 45° relative to the longitudinal axis of the tube 198 and each facing an aperture 214, 216 made in the "front" (i.e. facing parabolic mirrors 112, 114) wall of the INVAR (a trademark) tube 202. Two electronic optical choppers 218, 220, driven by two small motors 222, 224 anchored to the front wall of tube 202, are mounted in register with beam splitter 210 and mirror 212, respectively, and proximate thereto. Each chopper 218, 220 defines a circular plate driven by a motor 222, 224 and having one or two sector-shaped apertures 226. The two motors 222, 224 entrain the two beam choppers 218, 220 at different speeds, whereby each chopper 218, 220 accordingly stroboscopically pulses at two different frequencies the two horizontal laser beams reflected from beam splitter 210 and mirror 212, so that a specific laser pulse frequency be obtained for each beam, the frequencies being of any value provided one frequency is not the harmonic of the other.

It must be understood that the paths of the two beam fractions of the original laser beam reflected by beam splitter 210 and mirror 212 must be absolutely parallel, for the precise alignment of the collimating mirrors 112, 114 with their axes truly parallel.

Due to the nature of beam splitter 210, a fraction (say half) of the light of the laser beam from laser tube 202 will pass freely through the beam splitter toward mirror 212, to eventually be reflected by 90° thereagainst, while the other half of the light will be reflected by 90° against the beam splitter 210, wherein both reflected rays are parallel to each other.

The laser alignment periscope system 192 permits exact adjustment of the relative inclination of the parabolic mirrors 112, 114 about two right angles mirror axes via the adjusting bolts and nuts 182-188 of the front mounting plate 116, so that their focal point be common at the focal plane, by a method clearly illustrated in FIGS. 15 to 18 and now detailed.

Firstly, a "coarse" adjustment is made for each parabolic mirror in succession, say beginning with mirror 114 (see FIG. 8): the periscope system 192 is first transversely moved from its central position, in full lines, to the dotted lines position 192' in which its pivot axis 200 registers with the center of mirror 114. Mirror adjustments are made while the periscope tube 198 is first normal to and then aligned with the line joining the centers of the two mirrors 112, 114. Tube 198 is, for this purpose, pivoted around its horizontal pivotal axis 200 between the INVAR (a trademark) tube 198 and its support arm 194. In the two pivoted positions that beam splitter 210 and mirror 212 both register with mirror 114 at the two sidewisely radially opposite lateral edge sections of front parabolic mirror 114. Because the two reflected laser rays which leave the periscope system 192, are pulsed at different frequencies, they can be discriminated. Both rays are directed toward and reflected against mirror 114, to thereafter be directed and to converge toward the collector mirror 162, which latter mirror will fold the path of the two beams to bring the latter in focus about the focal plane system 166.

In the alignment procedure of the parabolic mirrors 112, 114, before the laser beam is fired from laser tube 202, the optical test bench operator must actuate the focal plane system entraining motor 183, to position the first test box 168 in its operative position. This first box 168 consists in the boresight test assembly 230 (see below), and encloses a pyroelectric detector 252 which is used during the alignment of the parabolic mirrors 112, 114, to bring their respective focal points in register with the line of sight of detector 252.

In a second step, the procedure detailed above is repeated for mirror 112 instead of mirror 114.

In a last third step, a "fine" adjustment of mirrors 112, 114 is made, in a fashion illustrated in the drawings. The LAPS 192 is displaced by its mechanical guidance system, transversely of the OTB frame 50, along its rail 175A-B, to a central position in which periscope tube 198 is aligned with the mirror centers and in which beam splitter 210 registers with the radially inner edge section of parabolic mirror 112 while end mirror 212 registers with the radially inner edge section of parabolic mirror 114. Hence, the collector mirror 162 will be between the two parallel reflected rays reflected against beam splitter 210 and mirror 212, respectively. These latter two rays will be pulsed at two different frequencies, again because of optical choppers 218, 220. Therefore, the operator can identify which reflecting parabolic mirror 112 or 114 requires fine adjustment.

We will now study in detail the focal plane system.

Figure 19:
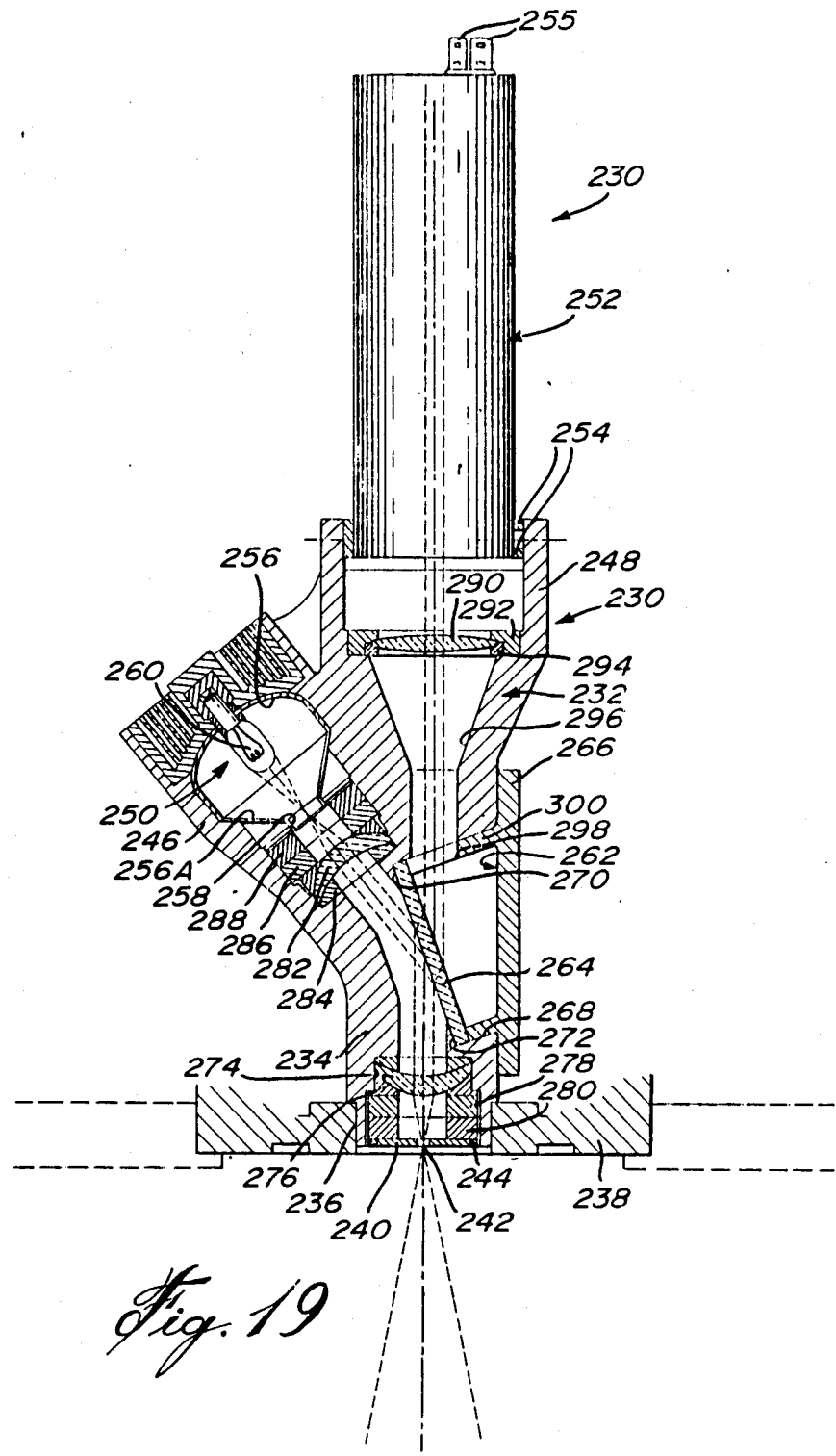
FIG. 19 is a longitudinal partly sectional elevational view of the boresight test assembly, forming part of the focal plane system embodied in the optical test bench shown in FIG. 3.
Figure 20:
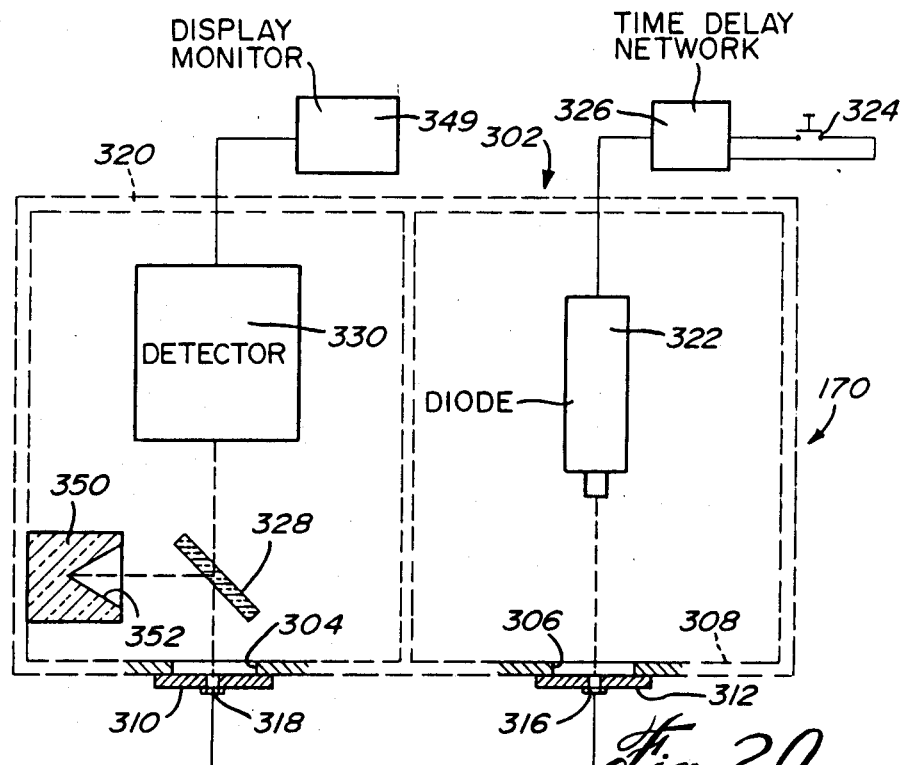
FIG. 20 is a partly schematic diagrammatic view of a first embodiment of laser ranger test assembly forming part of the focal plane system.

In a first test box 168 of the focal plane system, called the boresight test assembly (BTA) 230 (FIG. 19 of the drawings), there is defined a substantially Y-shaped hollow frame 232. The bottom end of the base leg 234 of the Y-frame 232 is frictionally lockingly inserted into an aperture 236 made in the bottom wall 238 of the BTA test box 168 wherein, upon the focal plane system being displaced along its guiding rails 175A-B, the bottom end of that base leg 234 is adapted to coincide with the focal point of the two parabolic mirrors 112, 114. The bottom end of the base leg 234 stops slightly short of the plane of that box bottom wall 238, and is closed on the outside by a small plate 240 screwed thereto and having a very small central pinhole 242 which is located at the focal point when the BTA test box 168 is in operative position. This small plate 240 is anchored in place by an annular frictional locking ring 244. To the two diverging legs 246, 248 of the Y-frame 232, there are provided a broad bandwidth source lamp 250 and a pyroelectric detector 252, respectively.

The detector 252 defines a housing of cylindrical shape which has at its outer end electronic connection pins 255 for connection to the electrical network of the exterior computer desk 118 of the optical test bench, and axially anchored at its inner end into the top end of the corresponding hollow Y-frame leg 248 by an immobilizing frictional collar 254. The lamp 250 is completely embedded into the hollow of the other Y-frame leg, and consists of a broad bandwidth spectrum lamp surrounded by a parabolic reflector 256 and connected to an electric power source, not shown and controlled from desk 118. Said reflector 256 has an open collar end 258 opposite the lamp filament 260 at the end of a conical reflector section 256A. The two diverging legs 246, 248 of the Y-frame make a relative angle of about 40 degrees with the leg 248 into which is anchored the pyroelectric detector 252 being substantially coaxial with the base leg 234 of the Y-frame but for a very slight lateral shift.

A block 262 carrying an inclined beam splitter 264 at one end and a diametrally larger stopper plate 266 at the other end is frictionally lockingly engaged into an aperture 268 made in the wall of the Y-frame hollow base leg 234 opposite the broad bandwidth spectrum lamp 250, wherein the beam splitter 264 abuts against two annularly disposed top and bottom seats 270, 272: the top seat 270 is made at the bottom apex of the two diverging frame legs 246, 248, while the bottom seat 272 is made about the apertured wall of the base leg 234. The beam splitter 264 makes an angle of about 20 degrees with respect to the optical paths of both the detector 252 and the broad bandwidth spectrum lamp 260, wherein the beam splitter 264 is exactly at the point of convergence of these two optical paths.

A first concavo-convex lens 274 is interposed between the pinhole 242 and the beamsplitter 264, for collimating the electro-magnetic wave beam coming from the optical module 38 and having engaged the pinhole 242, and/or for making the electro-magnetic wave beam coming from the broad bandwidth lamp 250 converge toward the pinhole 242 (since the focal point of the two parabolic mirrors 112, 114 must be about the pinhole of each one of the four test assemblies). This first lens 274 is convex relative to the pinhole 242 and is anchored in an annular frame 276 immobilized in a narrowed annular section of the hollow of the frame base leg 234, proximate the pinhole 242 and the bottom seat 272 of the beamsplitter 264 respectively. The first lens 274 is maintained at a fixed distance from the pinhole 242 by two large rings 278, 280 separating the first lens annular frame 276 and the pinhole small plate 240.

A second concavo-convex lens 282 is interposed between the broad bandwidth lamp 250 and the beam splitter 264, for collimating the electro-magnetic wave beams coming from the lamp 250 toward an area intermediate the lamp filament 260 and the second lens 282, i.e. restricted collar section 258. This second lens 282 is convex relative to the lamp filament 260 and is embedded into an annular frame 284 immobilized in a narrowed annular section of the hollow of the corresponding diverging frame leg 246, proximate the top seat 270 of the beam splitter. This second lens 282 is maintained at a fixed distance from the focalising area 258 of the lamp 260 by two large rings 286, 288 separating the reflector small end collar 258 (about which is located the focal point of the lamp reflector 256) and the second lens annular frame 284.

A third lens 290 is interposed between the pyroelectric detector 252 and the beam splitter 264. The third lens 290 is straight and tapers thicknesswise at its periphery, and is embedded in an annular cavity made between two annular frames 292, 294, with the larger annular frame 292 being frictionally immobilized into a narrowed section of the hollow of the corresponding diverging leg 248 of the BTA frame, while the smaller annular frame 294 is frictionally taken in sandwich between the periphery of the third lens 290 and the inner periphery of the large annular frame 292. Under the third lens 290, the hollow of the frame leg 290 becomes frusto-conical, at 296, to open into an aperture 298 made in the top wall 300 of the beam splitter mounting block 262.

This beam splitter 264 is characterized in that the optical paths of the detector 252 and of the lamp 260 will come to coincide with each other beyond the beamsplitter 264, to pass through the pinhole 242: the "top" face of the beamsplitter 264, i.e. that one in register with the detector 252, is at about 20 degrees from the optical path of the detector 252 so as to be completely transparent thereto, and to merely shift slightly laterally by refraction to the right the incoming electro-magnetic (em) wave from the module 38 passing through the pinhole 242 wherein it remains parallel thereto; whereas the "bottom" face of the beamsplitter 264, which is at about 20 degrees from the optical path of the broad bandwidth lamp 250, fully reflects the em wave therefrom toward the pinhole 242 and from there to the optical module 38 via the double collimating mirror system 112, 114.

Such behavior of two em wave beams relative to a common beamsplitter, to wit, full reflection on one side of the beamsplitter and full transmission on the other side of the beamsplitter, is possible only when both of these em wave beams strike the opposite faces of the beamsplitter at a substantially identical relative acute angle, called the "Brewster" angle.

When the laser alignment periscope system 192 is used, the focal plane system must be laterally displaced to bring the pinhole 242 of the BTA exactly at the focal point of the two parabolic off-axis mirrors 112, 114, since it is the detector 252 of the BTA which is used during the alignment. As such, this operation is facilitated by the factory adjusted position of the four focal plane system boxes 168-174, wherein their bottom walls or pinholes, such as bottom wall 238 of BTA 230, are coplanar with each other and coplanar with the focal plane of the parabolic mirrors 112, 114.

The boresight test assembly (BTA) 230 has a particular type of relatively "slow" pyroelectric detector 252, which is designed to receive the laser beam from the missile guidance laser (MGL), hidden behind one window 40-46 of the optical module (EOM) 38. This pyroelectric device 230 can receive em waves from the ultra-violet to the infra-red bandwidth of the electromagnetic wave spectrum, while the em waves emitted by the broad bandwidth spectrum lamp 260 extends from the visible to the infra-red.

The purposes of the boresight test assembly 230 are as follows: (a) beam mapping (i.e. to analyse the laser beam in space by analysing the beam of the missile guidance laser in window 42 of the optical module 38); (b) boresight testing, which permits to align the FLIR sensor with the missile guidance laser from the EOM 38; (c) for operation of the periscope alignement system 192 (parabolic mirrors adjustment); and (d) for the beam mapping of the laser ranger located in one of windows 42, 44 or 46 of the EOM 38.

The BTA beam splitter 264 is preferably made from a material consisting of a combination of Zinc and Selenide.

In the second testing box 170 of the focal plane system is disclosed a laser ranger test assembly (LRTA), see FIGS. 20 to 23. In a first embodiment thereof, at 302 in FIG. 20, the box includes two bores 304, 306 made in the bottom wall thereof 308 and closed by two plates 310, 312, each having a very small central pinhole 316, 318. In register with one pinhole 316 is anchored to the rear wall 320 of the box a LED 322 (powered by electric power means not shown) whose optical path coincides with that pinhole 316. An electrical switch 324 enables the ADATS TM operator to control firing of the latter LED 322 via a time delay network 326. In register with the other pinhole 318 is spacedly anchored an inclined beamsplitter 328 interposed between a pyroelectric detector 330 and this pinhole 318. The pyroelectric detector 330 is also anchored to the rear wall 320 of the LRTA box and includes a bottom aperture 332 through which extends the optical path thereof, the latter optical path passing through said other pinhole 318 via the registering beam splitter 328.

The pyroelectric detector 330 is connected to the computer means of the outside control desk 118 of the optical test bench, which includes a laser wave display monitor 349, for laser pulse analysis.

It is to be noted that the second pinhole 318 is where the incoming powerful laser beam from the laser ranger of the optical module 38 will eventually pass, and thus, in order to avoid damage to the pyroelectric detector 330, a laser beam attenuator block pad 350 is provided orthogonally to the laser beam path which passes through the pinhole 318. The attenuator pad 350 defines a conical cavity 352, in register with beamsplitter 328. The beam splitter 328 should be able to reflect toward the attenuator pad 350 a large fraction of the firing pulse of the laser ranger laser beam, leaving only a small fraction to enter the detector 330.

Hence, when the EOM laser ranger beam is fired, it will be detected by the OTB detector 330, and the OTB detector 330 will send a signal to the OTB computer 354 (see the diagram in FIGS. 29A-29B) for analysis of the laser wave.

With the switch 324, a simulated return signal may be induced by the ADATS TM operator via the LED 322. By taking into account the time when the switch 324 is actuated by the ADATS TM operator, the time delay constant of delay circuit 326, and the time when the simulated return LR signal from the LED 322 is received by the LR (laser ranger) transceiver in the optical module 38, one can deduct the distance, under the well known formula:

$$d = st$$

where s equals c, the speed of light.

It is to be understood that in operation, the box of the LRTA 302 will have to be displaced a first time, to make the second pinhole 318 coincide with the focal point of the double collimating mirror system, and a second time, to make the first pinhole 316 coincide therewith. Hence, the sensor and emitter tests of the laser ranger of the EOM 38 cannot be effected concurrently.

Figure 21:
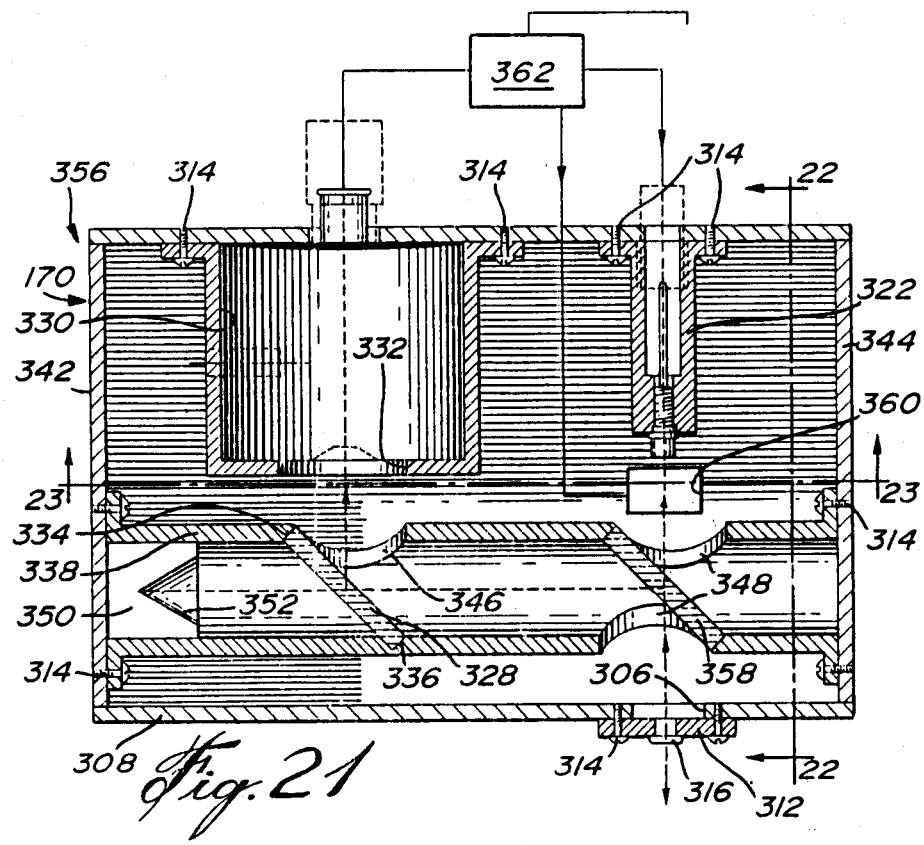
FIG. 21 is a cross-sectional view of a second embodiment of laser ranger test assembly forming part of the focal plane system, taken along lines 21—21 of FIG. 22.
Figure 22:
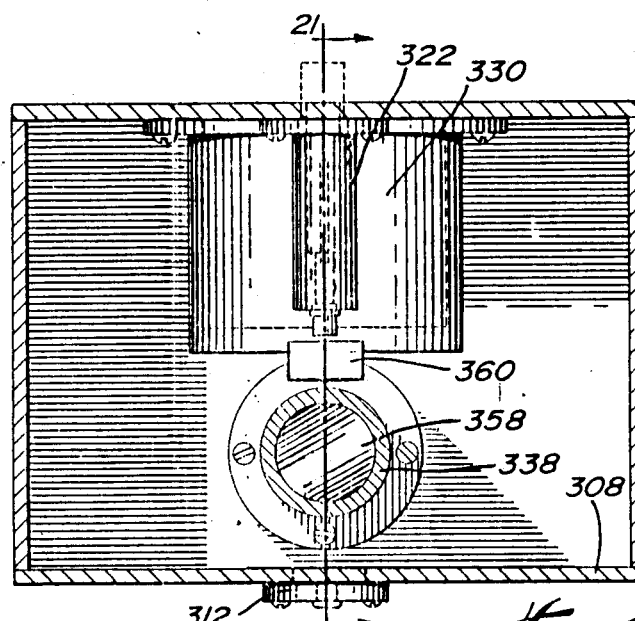
Figure 24:
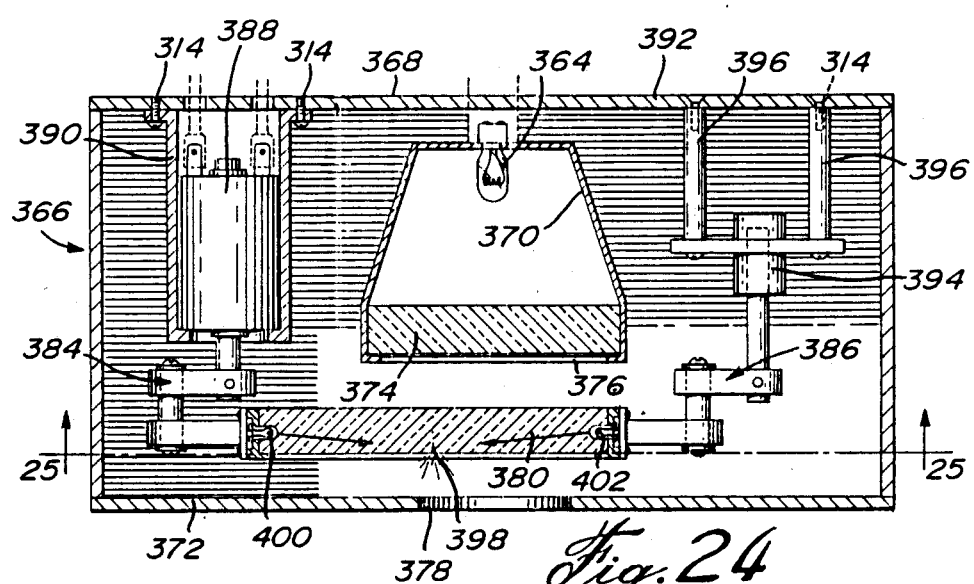
FIG. 24 is a cross-sectional view of a first embodiment of the third type of electromagnetic wave test means forming part of the focal plane system, to wit, the tracking test assembly.
Figure 25:
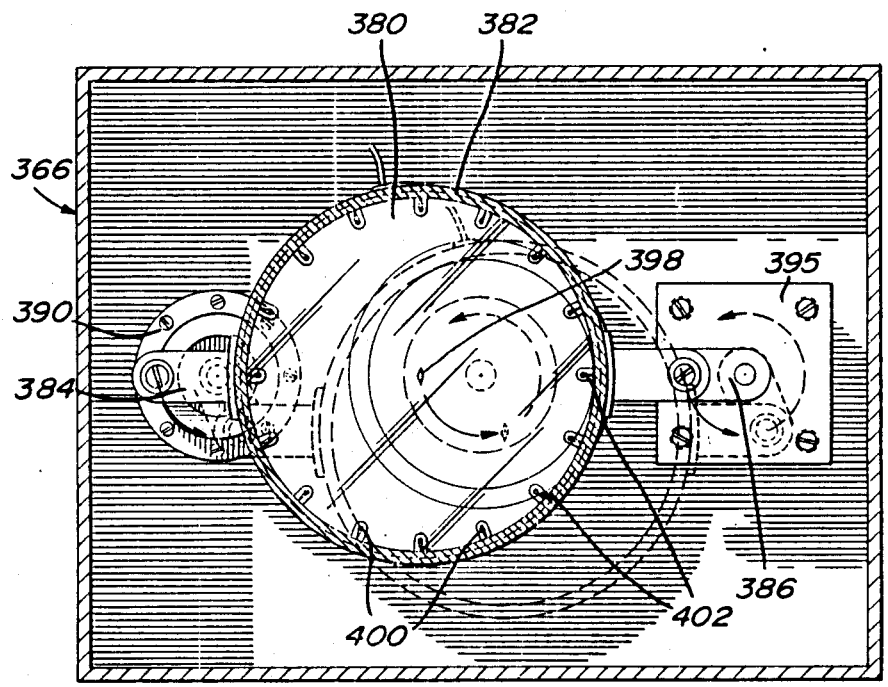
FIG. 25 is cross-sectional view taken along line 25—25 of FIG. 24.

In the second embodiment of the LRTA at 356 shown in more details in FIG. 21, it is seen that the housing for LED 322 and the housing for the pyroelectric detector 330 are fixed to rear wall 320 by screws 314. The bottom wall 308 in register with the abovementioned beamsplitter 328 need not be open (no bore, no pinhole). However, a second beam splitter 358 is anchored in register with the remaining pinhole 316, for reflecting a major fraction of the LR beam toward the pyroelectric detector 330 via the first beam splitter 328.

The beamsplitters 328 and 358 seat against notches 334, 336 made in a tube 338 screwed by screws 314 to the side walls 342, 344 of the box so as to be parallel to the front or "bottom" wall 308 (large apertures 346, 348 are made in these two inner walls 338 340, in axial register with the LED 322 and the pyroelectric detector 330, to allow em wave passage therethrough). A pockel cell 360 is interposed between the LED 322 and the second beam splitter 358, wherein under a known optical gate mechanism, the em wave beam from the LED 322 will be allowed to pass therethrough but not the fraction of the laser ranger beam from the EOM 38 which has not been reflected by the registering beam splitter 358.

More particularly, the Pockel cell 360 consists of an optical material which becomes polarized from an opaque condition to a transparent condition (relative to the specific em wave). However, as is known by competent physicists, the disadvantage of the Pockel cell is that it does introduce a high-voltage electronic background noise.

The LED emitter 322 and pyroelectric detector 330 are interconnected by a time delay network 362. Otherwise, the system remains similar to that of the first embodiment, numeral 302 in FIG. 20. In this second embodiment, no enable command switch has to be manually actuated, since both the LED and the pyroelectric detector can work concurrently through a single common pinhole, i.e. only one positioning of the LRTA box is required to make that pinhole coincide with the focal point of the double collimating mirror system.

The pyroelectric detector 330 of the LRTA 302 or 356 is of the "fast acting" type. The LRTA is used for the following tests: (a) telemetry (target ranging); (b) target discrimination; and (c) study of the physical characteristics of the laser pulse (wave form analysis).

In a third test box 172 of the focal plane system, called the tracking test assembly (TTA) at FIGS. 24 to 27, there is disclosed only an em wave emitter, to wit a broad bandwidth spectrum lamp 364 but no sensor. In the first embodiment of TTA shown in FIGS. 24-25 and denoted 366, the lamp 364 is anchored to the rear wall 368 of the TTA box, and an em reflector casing 370 is connected to the lamp 364. The front end of the reflector casing 370, which extends short of the front or bottom wall 372 of the TTA box 366, is closed by a glass plate 374 having an exteriorly frosted surface 376. The box 366 has a large bore 378 made on its front wall 372, in register with that frosted face 376 of glass plate 374. A second larger glass plate 380 is interposed between the frosted glass plate 374 and the bore 378, and includes a peripheral mounting frame 382 to which are pivotally connected at radially opposite ends a pair of operating crank arms 384, 386. The first crank arm 384 is power driven by a motor 388 supported in a housing 390 anchored by screws 314 to the rear wall 392 of the TTA box 366, while the second crank arm 386 is connected to a pivotal base 394 supported by a plate 395 anchored to the rear wall 392 of the box 366 by a pair of feet 396 through which engage anchoring screws 314. Crank arm 386 could also be driven by a second motor 388.

A crack or etching 398 is made centrally of the front face of the large glass plate 380 (that face in register with the bore 378) and a number of LED's 400 and 402 are anchored to the annular frame 382 of the glass plate 380. Hence, the large glass plate 380 is capable of translational motion relative to the diffuse light background defined by the illuminated frosted glass plate 374, wherein the etching 398 simulates a target moving relative to a background sky. The LED's may be a combination of infra-red (numeral 400) and "visible" (4,000 to 7,000 Å) (numeral 402) emitters, and, by varying the intensity of the background diffuse light 364, the operator of the optical test bench (outside of the vehicle 30, at control desk 118) can facilitate verifications by the operator of the optical module 38 of the discriminative or contrasting capacities of the associated TV sensor and missile tracker (MT/sensor) respectively.

[The missile tracker MT is a detector which follows, seeks and catches the exhaust thurst of missiles fired by the ADATS TM vehicle 30].

It is understood that both types of LED's 400, 402 emit toward the module 38. Preferably, a Zinc Selenide glass plate is used as the material for the two glass plates 374 and 380.

Figure 26:
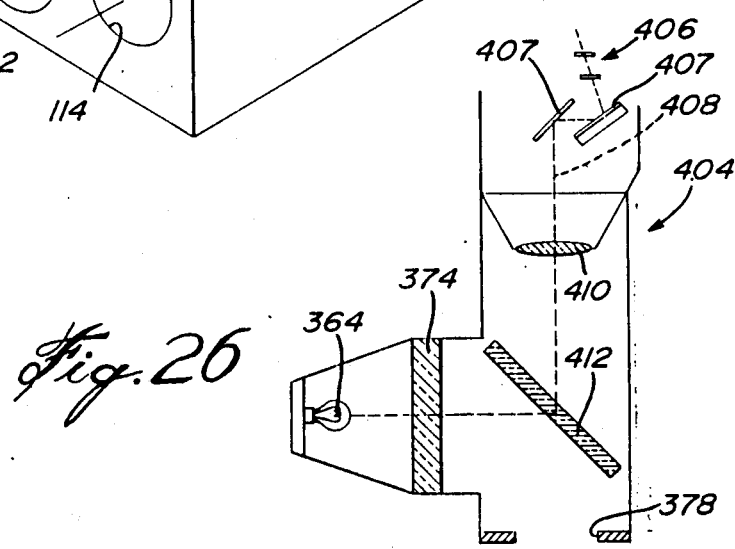
FIG. 26, on the third sheet of drawings, is a partly schematic cross-sectional view of a second embodiment of the tracking test assembly.

In a second embodiment of TTA, shown in FIG. 26 and denoted 404, there is no movable glass plate; rather, there is provided a conventional orthogonal optical scanner 406, including a light source successively reflecting on two mirrors 407 pivotable about axes normal to each other and reciprocated at equal or unequal speeds so that the resulting light beam 408 is scanned either in a circle or in various Lissajou shapes. Beam 408 goes through a lens 410 anchored to the box 404. Lens 410 is orthogonal to the frosted glass plate 374, from which diffuse light is emitted from the same broad bandwidth source lamp 364. A beam splitter 412 is anchored to box 404, at the convergence point of the longitudinal axes of the lamp 364 and of the scanner assembly 406, and is inclined at about 45 degrees from each one of said optical paths. Both optical beams exit from box bore 378. In this embodiment of tracking test assembly, the etching on a movable glass plate is replaced by a scanning light beam viewed as a target in front of a simulated background sky thanks to the beamsplitter 412 which virtually projects the diffuse light from the frosted glass 374. Again, there is simulated a target moving against a simulated sky background.

Figure 27:
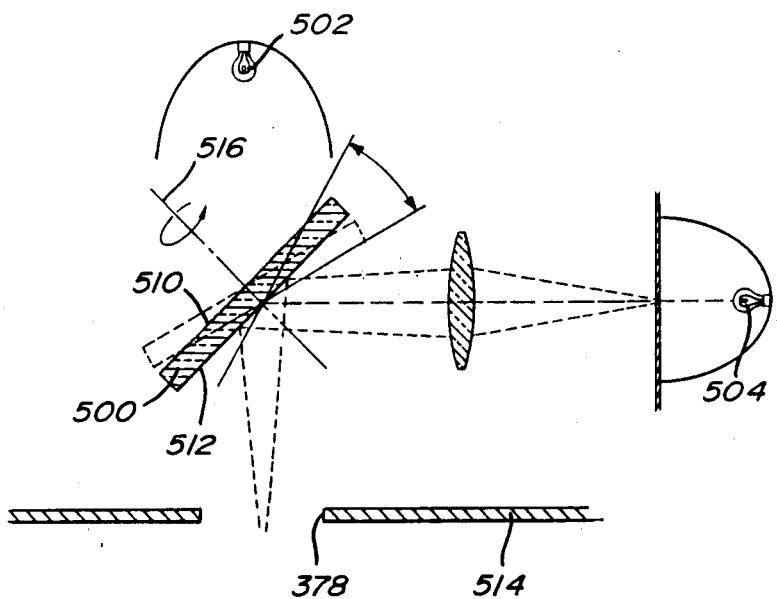
FIG. 27, on the thirteenth sheet of drawings, is a schematic cross-sectional view of a third embodiment of tracking test assembly.

FIG. 27 schematically shows a third embodiment of TTA. A clear Zinc Selenide glass plate 500 is mounted at the convergence zone of two similar broad bandwidth light sources 502, 504 which are orthogonally directed. The light beam from source 504 goes through a pinhole 506 simulating a target and through a biconvex lens 508. Light source 502 impinges on a frosted face 510 of plate 500 while light source 504 impinges on the opposite face 512 of plate 500. Face 512 is coated with a thin reflecting layer whereby the light beam converging at bore or hole 378 of casing 514 is about half from each light source with the target appearing on a diffuse lighted background. Plate 500 is power rotated about its normal axis 516 and simultaneously oscillated about an axis 518 normal to and intersecting axis 516 at coating 512. By varying the relative rotational and oscilating speeds, the target light spot at bore 378 will move along a straight line, in circle or various Lissajou figures.

Figure 28:
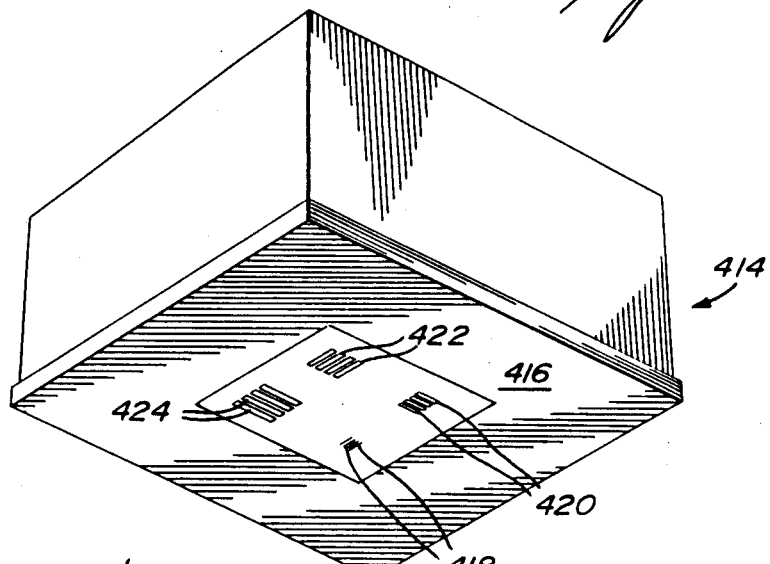
FIG. 28, on the eleventh sheet of drawings, is a perspective view of the fourth type of electromagnetic test means forming part of the focal plane system, to wit, a differential blackbody assembly box.

The last test of the focal plane system is the differential blackbody assembly test, shown in FIG. 28 and denoted 414. In this test, there is a standard blackbody box having an infra-red beam genertor therein. One free wall 416 of the blackbody box 414 includes a number of rectangular slits, and more particularly a first group of four very small parallel slits 418, a second group of four small parallel slits 420 spaced from the group of very small slits 418, a third group of four mediumsized parallel slits 422 spaced from the other slits, and a fourth group of four relatively large parallel slits 424, spaced from the other slits and orthogonal to the group of very small slits 418. The slits of each group have similar dimensions, and are coplanar to each other so as to be within the focal plane of the two parabolic mirrors 112, 114. In each group, the four slits, which are of substantially same dimensions, define simulated infra-red emitting targets adapted to be detected by a corresponding optical module sensor, when either one of the four groups is positioned exactly in register with the focal point of the parabolic mirrors.

The "slits" 418 of one group of slits are of a smaller yet similar shape relative to that of the other groups, wherein infra-red sensitivity tests can be effected by the optical module operator provided the OTB operator informs him what group of slits has been chosen as simulated targets.

The present differential blackbody assembly test is especially suited for testing the FLIR sensor performance from the EOM module 38.

Another electromagnetic wave test could be provided: the simulated sun flood lamp system, see FIG. 8, which would necessitate a broad bandwidth source lamp 430. Lamp 430 is anchored to the top of a post 432 itself anchored at its bottom end into a slider block 434 slidably mounted to the lower guiding rail 196 of the laser alignment periscope system 192. The lamp 430 is directed toward the sensors of the electro-optical module 38, i.e. toward the casing rear apertures 152, 154. Displacement of the slider block 434 of the lamp post 432 is controlled by a threaded rod 436 engaging the block 434. Rod 436 is anchored to the side wall 50C of the casing and extends parallel to and slightly upwardly of the threaded rod 197 (which controls the lateral displacement of the LAPS 192).

The sun flood lamp system test is a test to verify the discriminative properties of the infra-red sensors from the EOM 38. When not in operation the lamp 430 is slided along rail 196 to its inoperative positon shown in full lines in FIG. 8, i.e. against the side wall 50C. When the lamp 430 is to be used for simulating the effect of the sun, slider 434 is displaced along rail 196 to bring the lamp 430 in register with the optical path of one EOM sensor. By varying the intensity of this lamp 430, the OTB operator can simulate the interference the sun would create during operation of an infra-red sensor, particularly the FLIR sensor, e.g. if the sun was substantially in axial register with FLIR sensor and the target (on the opposite side of the the target). In other words, how well could the FLIR sensor detect the infra-red wave emitting thrust from the target relative to the sun which, while being much farther away than that target, nonetheless generates a very high infra-red radiation level. Accordingly, the sun flood lamp system test should be operated as a distinct test.

Control units, connected to the computer 354, are provided for monitoring the differential blackbody assembly radiator 414, the source lamps 260 and 364, the pyroelectric detectors 252 and 330, the drive motor 388 for the TTA test 366, the diodes 322, 400 and 402, and the laser alignment periscope system 192. Thus, a single operator at the exterior computer desk 118 can carry out the various tests in conjunction with the operator of the e-o module 38.

Figure 13:
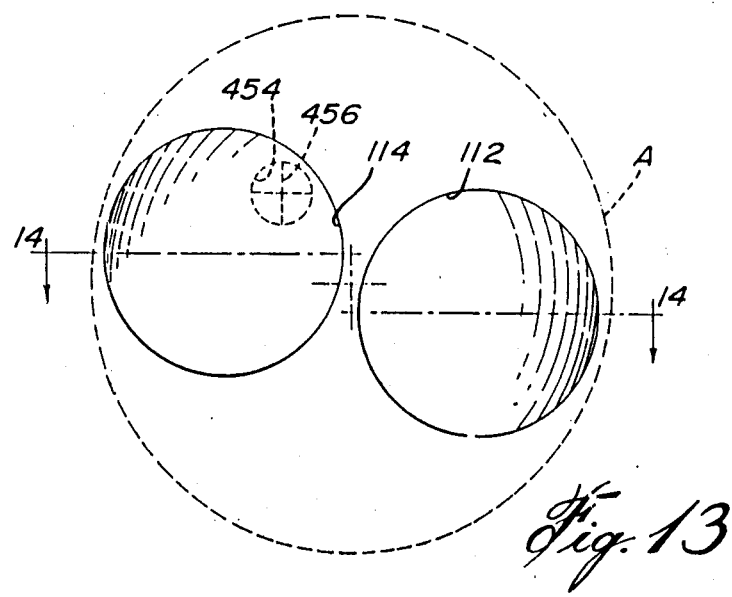
FIG. 13 is a schematic rear end view of the two parabolic mirrors.
Figure 14:
FIG. 14 is a cross-sectional view taken along line 14—14 of FIG. 13.

Preferably, there is provided cross-hair means 450 to facilitate the preliminary adjustments of the position of the optical test bench relative to the ADATS TM, at the time when the air-tight skirt 122 has not yet been placed in position between the EMO 38 and the optical test bench 48. The cross-hair means 450 are shown in FIGS. 5 and 13 of the drawings, and consist of a plate 452 pivotally mounted to the ceiling 50D of the OTB casing 50 by any suitable means. Plate 452 is pivotable between an inoperative position, in which it abuts against ceiling 50D, and an operative position, in which it is orthogonal thereto. Plate 452 includes a circular bore 454 having a ± shaped cross-hair 456. The ADATS TM operator in the crew compartment thereof has on its computer monitor (not shown) a second cross-hair forming part e.g. of an electronic sheet from a suitable computer software.

In its operative position, plate 452 is adapted to come in axial register with the optical path of the T.V. camera sensor of the electro-optical module 38. The idea is to bring the physical cross-hair 456 in exact register with the computer cross-hair. By looking into the T.V. camera (while remaining into the crew compartment), the ADATS TM opertor instructs the OTB operator with said walkie talkie means to displace the external positioner 54 until a match is established between the two cross-hairs. Hence, in such operative position of the cross-hair plate 452, the latter extends in front of one parabolic mirror, 114, which is to say, mirror 114 serves no purpose during this preliminary alignment procedure. Alternately however, should the ambient light conditions not be sufficient, it could be envisioned that the broad bandwidth source lamp 250 of the BTA 230 be alighted and directed toward the "front face" of the cross-hair 456, via the collector mirror 162 and the parabolic mirror 114, to enhance the contrast of the cross-hair 456 relative to the background, i.e. to enable the T.V. camera user to have a view "against the light".

Figure 29A:
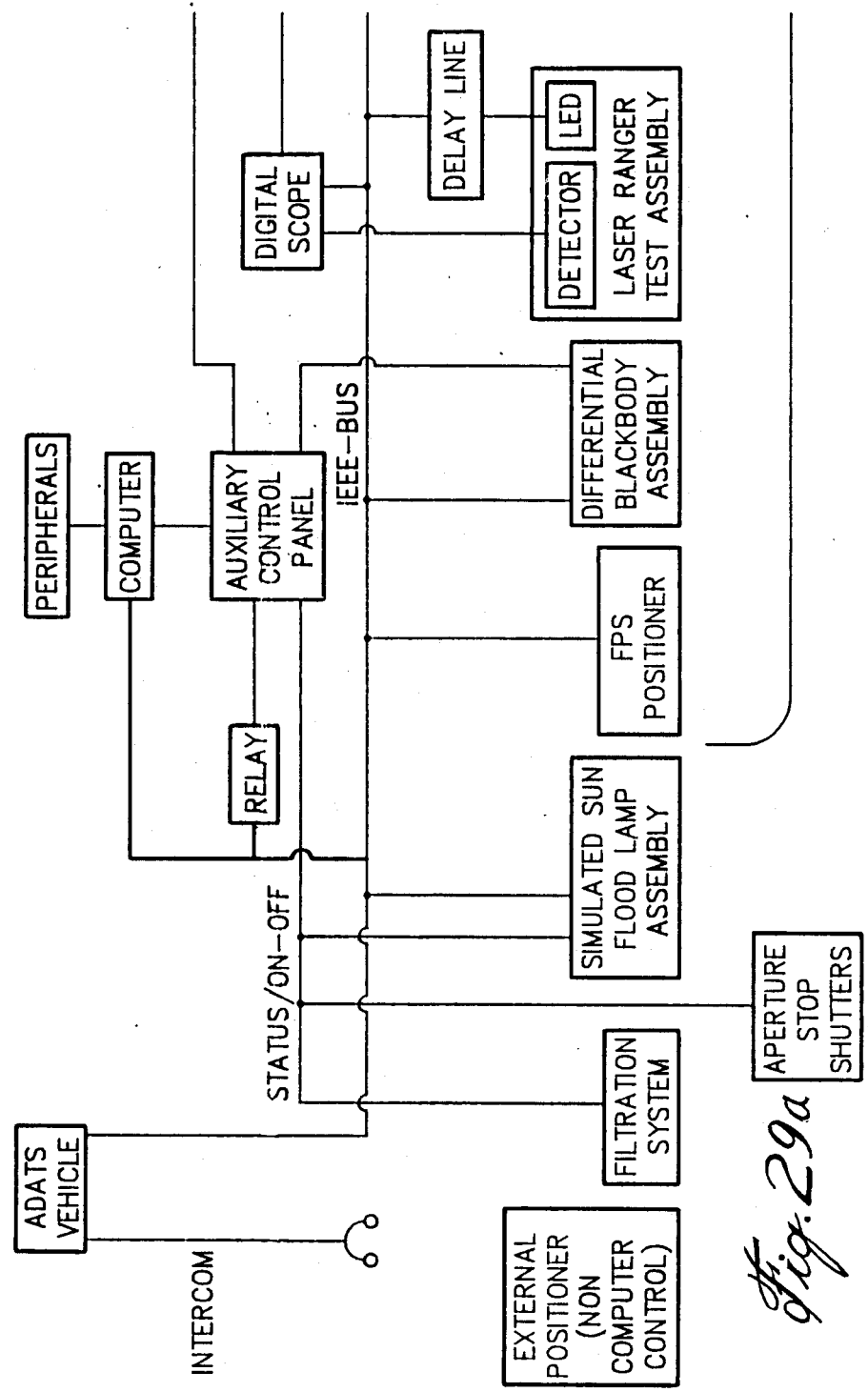
FIGS. 29A and 29B represent, spread over two sheets of drawings from left to right, a single diagrammatical view of the control system of the optical test bench in accordance with the teachings of the invention.
Figure 29B:
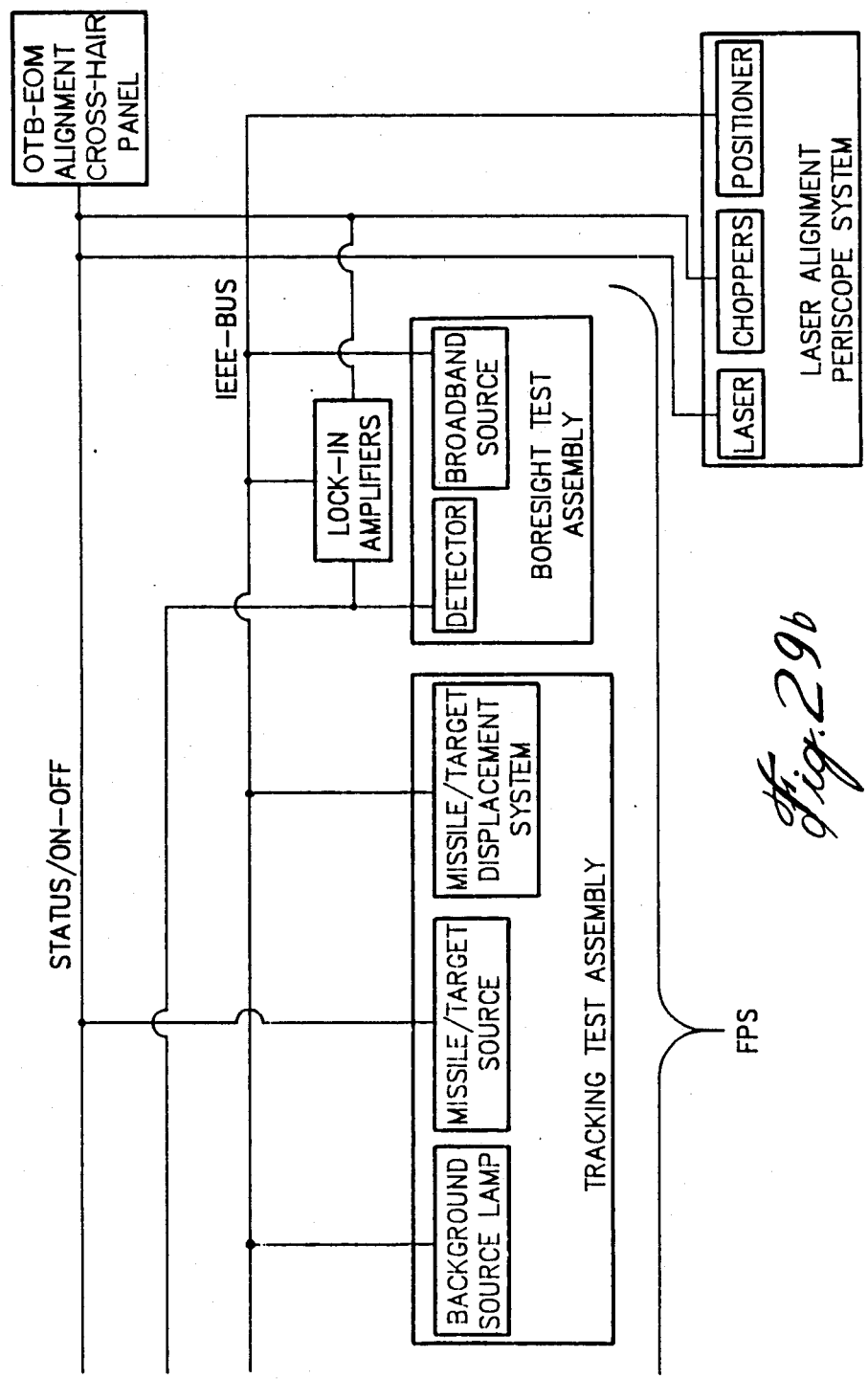

FIGS 29A-29B show a diagram of the operative interconnections of the present optical test bench with the ADATS TM air and ground surveillance system, which summarizes the above detailed description of the drawings.

It is envisioned that other electromagnetic wave test means be effected while still remaining within the scope of the invention. For instance, throughout the disclosure, whenever an electromagnetic wave is referred to, it is meant to designate radiations capable of being reflected by mirror means and having any one of various known wavelengths, including microwave, infra-red, "visible", ultra-violet, etc. . . At the level of the focal plane system, when a pyroelectric detector is referred to, it should be understood that other types of detector sensitive to various electromagnetic wave beams are envisioned to be used as a replacement for the pyroelectric detector, wherein various electromagnetic wave beams can be detected and further corresponding tests be effected which would remain well within the scope of the present invention.

In conclusion, two characteristics of the present optical test bench are paramount to the invention: mechanical precision and optical trustworthiness. The present optical test bench 48 allows testing of both the sensor part and the laser part of the optical module 38, for calibration purposes. This testing can be done on the ADATS TM 30 during effective operation of the Module 38, with absolute laser safe conditions.

I claim:

1. In combination, an optical test bench and data acquisition means, for concurrently testing the properties of an electromagnetic wave sensor and at the same time those of an electromagnetic wave emitter, the sensor and emitter mounted proximate to each other at a fixed area in space; the test bench comprising:
   (a) a main frame;
   (b) mirror means, mounted to said main frame and positionable in axial alignment with said sensor and emitter, wherein said mirror means defines two parabolic off-axis mirrors having a common virtual parabolic reflecting surface, and adjustment means to adjust the position of either one of these two parabolic mirrors relative to the other and relative to said main frame; and
   (c) electromagnetic wave test means, mounted to said main frame about the focal plane of said mirror means; said data acquisition means being capable of comparing and correlating electromagnetic wave values obtained by said test means with performance requirements values.

2. A combination of optical test bench and data acquisition means as defined in claim 1, wherein said main frame forms part of a casing enclosing said mirror means, and test means, and further including means to sealingly connect one end of said casing to said sensor and emitter.

3. A combination of optical test bench and data acquisition means as defined in claim 2, further including an air recirculating, dehumidifying, and filtering system, connected to said casing, for providing a controlled environment within this casing.

4. A combination of optical test bench and data acquisition means wherein said air filtering system screens all macroscopic particles in suspension in the air.

5. A combination of optical test bench and data acquisition means as defined in claim 4, wherein said air filter system is a "class 100" system.

6. A combination of optical test bench and data acquisition means as defined in claim 3, wherein said two parabolic mirrors are collimating mirrors, and further including alignment means for enabling adjustment of the position of said parabolic collimating mirrors to bring their focal points together at said focal plane.

7. A combination of optical test bench and data acquisition means as defined in claim 6, wherein said two parabolic mirrors are mounted to a single common rigid mounting plate which forms part of said main frame and about which said adjustment means is operative.

8. A combination of optical test bench and data acquisition means as defined in claim 7, wherein said adjustment means includes: a mirror mounting frame, for each one of said parabolic mirrors; and universal pivot member pivotally interconnecting the center of each corresponding parabolic mirror frame to said common mounting plate; and at least three angularly spaced, adjustment screw members, each adjustable biasing one peripheral radial section of one said mirror mounting frame toward of or away from said common mounting plate, each screw member being accessible from the exterior of said casing whereby the integrity of the controlled environment obtained within said casing thanks to said air recirculating, dehumidifying, and filtering system, is not threatened.

9. A combination of optical test bench and data acquisition means as defined in claim 7, wherein said common mounting plate is U-shaped, is sealingly frictionally lockingly inserted into a corresponding straight cavity made in the front wall of said main frame casting, and includes a number of longitudinal reinforcing strut members to prevent any displacement of the parabolic mirrors relative to said main casing under the load of said parabolic mirrors or to reduce to the strict minimum thermal expansion/retraction play of its constituting material.

10. A combination of an optical test bench and data aquisition means as defined in claim 6, further including an external positioner for displaceing said casing of the optical test bench over ground.

11. A combination of optical test bench and data aquisition means as defined in claim 10, wherein a coarse adjustment of the position of said casing relative to said sensor is made possible by a pair of spaced cross hair members, positioned along the optical path of the sensor with one cross hair member proximate to said mirror means and with the other cross hair member proximate said sensor; and means to verify their axial alignment whereby said casting is therefore adjustably displaced relative to said sensor.

12. A combination of optical test bench and data acquisition means as defined in claim 10,
further including displacement means carried by said external positioner to at least induce vertical and transverse displacement of the optical test bench main frame relative to said external positioner;
wherein said sensors and emitters are destined to be embedded into a housing enclosing an optical device having at least two windows, behind each of which can be mounted at least one sensor or emitter, said two parabolic mirrors having a field of view then encompassing the electro-magnetic beams emitted by said emitter or received by said sensors; said casing of the optical test bench further including aperture means at one end thereof, designed to operatively come in register with said optical device housing windows.

13. A combination of an optical test bench and data acquisition means as defined in claim 12, further including a semi-rigid skirt for use in connecting said aperture means of said casing of the optical test bench to said optical device, whereby the combination of said casing, of said skirt and of said optical device is designed to constitute an air-tight assembly.

14. A combination an optical test bench and data acquisition means as defined in claim 6, further including an external positioner for displacing said casing of the optical test bench over ground; said air recirculating, dehumidifying, and filtering system being mounted into said external positioner within a box; said box having at least one air inlet and one air outlet; said casing of the optical test bench having at least one air inlet, proximate said electromagnetic wave test means, and at least one air outlet, proximate said mirror means, wherein an air inlet of the casing is sealingly connected to a corresponding air outlet of said box by a flexible tube, and an air outlet of the casing is sealingly connected to a corresponding air inlet of said box by another flexible tube.

15. A combination of an optical test bench and data acquisition means as defined in claim 12, wherein said external positioner is made of an upper and a lower half-part, vertically movable relative to each other, said external positioner being further provided with anti-vibration means mounted between said upper half part and said casing.

16. A combination of an optical test bench and data acquisition means as defined in claim 15, further including vertically adjustable jack pad members, mounted to the periphery of said lower half part to stabilize said external positioner on the ground.

17. A combination an optical test bench and data acquisition means as defined in claim 12, wherein said data acquisition means thereof are embodied in a control desk positioned proximate to the assembly constituted by the operatively interconnected external positioner, optical test bench casing and the wave sensors and emitter; said control desk connected to said test means, via the external positioner, through a coaxial cable.

18. A combination of an optical test bench and data acquisition means as defined in claim 17, wherein said data acquisition means in the control desk includes at the minimum: a computer, data storage means associated to the computer, a monitor, a keyboard, a printer, and an oscilloscope.

19. A combination of an optical test bench and data acquisition means as defined in claim 18, wherein said control desk further includes control knobs and displays, for monitoring and controlling said displacement means, and also including walkie-talkie means to enable the operator of said control desk to communicate with the operator of said optical device.

20. A combination of an optical test bench and data acquisition means as defined in claim 13, wherein said aperture means of the casing of the optical test bench includes two aperture stops made in the corresponding end wall of that casing; further including two shutter panels releasably closing said two aperture stops, said shutter panels transparent to a large bandwidth of the electromagnetic wave spectrum, the shutter panels being arranged to clear said two aperture stops when said skirt is installed in position.

21. A combination of optical test bench and data acquisition means as defined in claim 20 wherein said mirror means further includes a collector mirror, mounted by a mounting arm within said casing of the optical test bench intermediate said parabolic off-axis collimating mirrors and said aperture stops, along the optical path thereof of the parabolic mirrors orthogonally to said wave test means; said collector mirror being inclined so as to fold an electromagnetic wave path coming from said wave test means toward said collimating mirrors, and alternately or concurrently, to fold another wave path coming from said emitter via said collimating mirrors toward said wave test means; said collector mirror being positioned between the virtual axial projections of the whole surface of the two collimating mirrors, so as not to intersect the projections thereof.

22. A combination optical test bench and data acquisition means as defined in claim 21, wherein said mounting arm of the collector mirror includes micrometric screw displacement means, to adjustably displace said collector mirror toward or away from said collimating parabolic off-axis mirrors.

23. A combination of optical test bench and data acquisition means as defined in claim 21, wherein said alignment means includes an alignment periscope system, slidably mounted to a guiding rail which is anchored within said casing exteriorly of said virtual axial projections of the collimating parabolic mirrors, said guiding rail extending between said collector mirror and said aperture stops transversely of said casing.

24. A combination of optical test bench and data acquisition means as defined in claim 23, wherein said alignment periscope system includes: an anchor arm, slidably engaged onto said guiding rail, a hollow tube transversely pivoted to said anchor arm whereby said hollow tube is caple of rotation as well as translation relative to said collimating parabolic mirrors, a source of phased light anchored to said hollow tube and defining a straight beam extending exactly at the center of the longitudinal axis of said hollow tube, a reflecting mirror anchored into said hollow tube at its end opposite said source of light and defining an acute angle relative to said longitudinal axis of the hollow tube, a beam splitter anchored into said hollow tube betwen said reflecting mirror thereof and said source of light and parallel to this reflecting mirror and adapted to reflect a fraction of the incident said straight beam and to allow the remainder of the incident said straight beam to pass therethrough to strike said reflecting mirror, said hollow tube having two transverse bores in register with said reflecting mirror and said beam splitter respectively for passage of the corresponding reflected beams; and two beam choppers, anchored to said hollow tube in respective register with said two transverse bores thereof for pulsing said reflected beams at two different non-harmonic frequencies.

25. A combination of optical test bench and data acquisition means as defined in claim 24, wherein each one of said beam choppers consist of disc plate having two sector-shaped openings and rotatably driven by a motor.

26. A combination of optical test bench and data acquisition means as defined in claim 24, wherein the frequency differential of the two reflected beams pulsed by said two beam choppers is about 33%.

27. A combination of optical test bench and data acquisition means as defined in claim 23, wherein said source of phased light is chosen from the group consisting of helium-neon laser and a diode laser.

28. A combination of optical test bench and data acquisition means as defined in claim 20, wherein said wave test means includes wave test assemblies, each for testing different electromagnetic wave values, said assemblies disposed side by side at said focal plane, and further including driving means for selectively shifting each assembly to a testing position in register with the focal point of the two parabolic mirrors.

29. A combination of optical test bench and data acquisition means as defined in claim 28, wherein one of said wave test assemblies is a differential blackbody assembly source test, consisting of: a standard blackbody box having an infra-red beam generator therein and being positioned so that at least one slit made on one wall thereof comes to said testing position, so as to define a simulated infra-red emitting target which can be detected by an infra-red sensitive sensor of the optical device via said mirror means.

30. A combination of optical test bench and data acquisition means as defined in claim 29, wherein there are four similar slits on said one wall of the differential blackbody assembly source test box, each slit having a rectangular shape.

31. A combination of optical test bench and data acquisition means as defined in claim 30, wherein there is a number of groups of said four slits, similar in shape but different in relative dimensions, wherein the sensitivity of said sensor of the optical device can be calibrated.

32. A combination of optical test bench and data acquisition means as defined in claim 28, wherein one of said wave test assemblies includes a laser ranger test assembly source test box, consisting of: two pinholes made on one same wall thereof; a LED in register with one of said pinholes and anchored within the box; a switch controlling the LED via a time delay network; in register with the other pinhole is spacedly anchored and inclined beamsplitter, interposed between a pyroelectric detector and this latter pinhole; the pyroelectric detector being itself connected to said data acquisition means, for laser pulse analysis; wherein said test box will have to be displaced a first time, to bring said one pinhole in register with the focal point of said mirror means, and a second time, to bring said other pinhole in register therewith.

33. A combination of optical test bench and data acquisition means as defined in claim 28, wherein one of said wave test assemblies is a boresight test assembly source test, including: a light emitter and pyroelectric detector assembly whose optical paths pass through a common pinhole, made on a test surface thereof, via a beamsplitter, the plane of said beamsplitter defining a Brewster angle with each of said optical paths; a first lens being interposed between the pinhole and the beamsplitter, for collimating the light beam from the optical device having engaged the pinhole, and/or for making the light beam coming from said light emitter converge toward the pinhole; a second lens being interposed between said light emitter and the beam splitter, for collimating the light rays of said light emitter about a locus intermediate the light emitter proper and the second lens.

34. A combination of optical test bench and data acquisition means as defined in claim 33, further including a third lens, interposed between the pyroelectric detector and the beam splitter.

35. A combination of optical test bench and data acquisition means as defined in claim 28, wherein one of said wave test assemblies is a tracking test assembly source test box characterized in that it simulates a target which moves along a simulated sky background; this test assembly including: a glass plate, being transparent to the wave lengths that are used, and to the periphery of which are mounted a number of light emitting diodes (LED) which emit toward a sensor of said optical device; translational motion means, to displace said glass plate within said box; and a diffused light source at the back of said glass plate; wherein a marking is made on the glass plate, so that by moving the latter, the marking appears to be a target on the sky background.

36. A combination of optical test bench and data acquisition means as defined in claim 35, wherein the glass plate is made of a ZnSe transparent glass material.

37. A combination of optical test bench and data acquisition means as defined in claim 35, wherein said diodes include: a first type, emitting in the visivle band, for a TV camera sensor, and a second type, emitting in the infra-red band, for a missile tracking sensor.

38. A combination of optical test bench and data acquisition means as defined in claim 35, wherein said marking is made after an etching made at the center of said glass plate.

39. A combination of optical test bench and data acquisition means as defined in claim 28, wherein one of said wave test assemblies includes a tracking test assembly source test box, capable of simulating a target moving along a simulated sky background; this test including: a beam splitter plate, mounted at the convergence zone of two similar broad bandwidth light sources which are orthogonally directed; the light beam from one light source going through a pinhole simulating a target and through a biconvex lens to be reflected by one face of said plate; the other light source impinging on an opposite frosted face of said plate and passing through the latter; and means to rotate said plate about its normal axis and to simultaneously oscillate same about an axis normal to and intersecting the first mentioned axis at said one face; wherein by varying the relative rotational and oscillating speeds, the target light spot will move along a straight line, in circle or in various Lissajou figures.

40. A combination of optical test bench and data acquisition means as defined in claim 32, wherein, in order to avoid damage to the pyroelectric detector, a beam attenuator pad is provided orthogonally to the laser beam path which passes through the pinhole, so as to enable the beam splitter to reflect toward the attenuator a large fraction of the laser ranger laser beam, leaving only a small fraction to enter the pyroelectric detector.

41. A combination of optical test bench and data acquisition means as defined in claim 28, wherein one of said wave test assemblies includes a laser ranger test assembly source test box, consisting of: one pinhole made on one wall thereof; a LED in register with the pinhole and anchored within the box; a pyroelectric detector being connected to said data acquisition means, for laser pulse analysis; two inclined beamsplitters, one in register with the pyroelectric detector and the pinhole, the other in register with the LED; an electro-optical gate means being interposed between the LED and the other beam splitter, wherein the light beam from the LED will be allowed to pass therethrough but not the laser pulse fraction which has not been reflected by the registering beam spliter; the LED and pyroelectric detector being interconnected by a time delay network.

42. A combination of optical test bench and data acquisition means as defined in claim 41, wherein said electro-optical gate means is a pocket cell.

43. A combination of optical test bench and data acquisition means as defined in claim 28, or 34, further including a simulated sun flood lamp source test, consisiting of a variable output broad bandwidth light source releasably mounted in axial register with and directed toward said sensor.

44. A combination of optical test bench and data acquisition means as defined in claims 39, 40 or 42, further including a simulated sun flood lamp source test, consisting of a variable output broad band light source releasably mounted to said casing in axial register with and directed toward said sensor.

45. A combination of optical test bench and data acquisition means as defined in claim 28, further including a simulated sun flood lamp source test, consisting of a light source facing said aperture stops and movably mounted to said main frame between first and second positions exteriorly of and in the optical path of said mirror means repectively wherein, said sun flood lamp test can be effected concurrently with said wave test means.

46. In combination, an optical test bench and data acquisition means, for concurrently testing the properties of an electromagnetic wave sensor and at the same time those of an electromagnetic wave emitter, the sensor and emitter mounted proximate to each other at a fixed area in space: the test bench comprising:
  (a) a main frame:
  (b) mirror means, mounted to said main frame and positionable in axial alignment with said sensor and emitter, wherein said mirror means defines a single parabolic reflecting mirror, and adjustment means to adjust the orientation of said reflecting mirror, said main frame forming part of a casing enclosing said parabolic mirror, and test means being provided to sealingly connect one end of said casing to said sensor and emitter, said parabolic mirror being at the end of aid main frame opposite said casing one end: and
  (c) electomagnetic wave test means, mounted to said main frame about the focal plane of said mirror means: said data acquisition means being capable of comparing and correlating electromagnetic wave values obtained by said test means with performance requirements values.

* * * * *